United States Patent
Meyer

(10) Patent No.: US 7,994,840 B2
(45) Date of Patent: Aug. 9, 2011

(54) RMS DETECTOR WITH AUTOMATIC GAIN CONTROL

(75) Inventor: Robert G. Meyer, Berkeley, CA (US)

(73) Assignee: Maxim Integrated Products, Inc., Sunnyvale, CA (US)

(*) Notice: Subject to any disclaimer, the term of this patent is extended or adjusted under 35 U.S.C. 154(b) by 61 days.

(21) Appl. No.: 12/123,198

(22) Filed: May 19, 2008

(65) Prior Publication Data

US 2009/0284300 A1    Nov. 19, 2009

(51) Int. Cl.
G06G 7/20 (2006.01)
G06G 7/24 (2006.01)
G06F 7/556 (2006.01)

(52) U.S. Cl. ........................... 327/348; 327/346

(58) Field of Classification Search .......... 327/346–348; 375/345
See application file for complete search history.

(56) References Cited

U.S. PATENT DOCUMENTS

| | | | |
|---|---|---|---|
| 3,807,816 A | 4/1974 | Hamburg | |
| 5,659,582 A * | 8/1997 | Kojima et al. | 375/345 |
| 6,172,549 B1 | 1/2001 | Gilbert | |
| 6,185,482 B1 | 2/2001 | Egolf | |
| 6,204,719 B1 | 3/2001 | Gilbert | |
| 6,243,652 B1 | 6/2001 | Fawcett | |
| 6,348,829 B1 | 2/2002 | Gilbert | |
| 6,411,072 B1 | 6/2002 | Feldman | |
| 6,429,720 B1 | 8/2002 | Gilbert | |
| 6,501,329 B1 | 12/2002 | Petrofsky | |
| 6,516,279 B1 | 2/2003 | Jansen | |
| 6,525,601 B2 | 2/2003 | Gilbert | |
| 6,548,999 B2 | 4/2003 | Wong | |
| 6,549,057 B1 | 4/2003 | Gilbert | |
| 6,556,084 B2 * | 4/2003 | Sowlati | 330/296 |
| 6,651,036 B2 | 11/2003 | Petrofsky | |
| 6,696,888 B2 * | 2/2004 | Gilbert | 327/560 |

(Continued)

FOREIGN PATENT DOCUMENTS

GB    2317514 A    3/1998

(Continued)

OTHER PUBLICATIONS

Search Report and Written Opinion for PCT/US2009/042750, Jan. 8, 2010, European Patent Office as ISA, 18 pages.

*Primary Examiner* — Lincoln Donovan
*Assistant Examiner* — Diana J Cheng
(74) *Attorney, Agent, or Firm* — North Weber & Baugh LLP

(57) ABSTRACT

Embodiments of the present invention provide systems, devices and methods for detecting the RMS value of a signal. The RMS detector uses multiple variable-gain stages and internal gain control to generate an RMS output signal based on an arbitrary signal input. This RMS detector significantly reduces the signal swings seen on a squarer within prior art RMS detectors and reduces the detector's dependency on DC offsets at low signal levels and overload errors at high signal levels. The embodiments of the present invention also improve the accuracy of the RMS detector within large dynamic signal ranges by obviating the operation of a squarer in saturation or out of the squaring region. Accordingly, embodiments of the present invention are able to more accurately detect RMS values on a signal, operate over relatively higher signal ranges, and better function within different signal modulation schemes, particularly those with large peak-to-average ratios.

32 Claims, 16 Drawing Sheets

U.S. PATENT DOCUMENTS

| | | |
|---|---|---|
| 6,777,999 B2 * | 8/2004 | Kanou et al. .................. 327/346 |
| 6,801,075 B2 | 10/2004 | Gammie |
| 6,819,090 B1 | 11/2004 | Kachline |
| 6,861,890 B2 | 3/2005 | Gilbert |
| 7,002,394 B1 | 2/2006 | Gilbert |
| 7,030,567 B2 | 4/2006 | Ballenger |
| 7,034,473 B2 | 4/2006 | Ballenger |
| 7,106,604 B2 | 9/2006 | Nash |
| 7,187,160 B2 | 3/2007 | Higgins |
| 7,197,292 B1 | 3/2007 | Kouwenhoven |
| 2004/0223349 A1 | 11/2004 | Nash |
| 2006/0256593 A1 | 11/2006 | Pierson |

FOREIGN PATENT DOCUMENTS

| | | |
|---|---|---|
| WO | 2004075401 A1 | 9/2004 |

* cited by examiner

RMS DETECTOR WITH AUTOMATIC GAIN CONTROL

BACKGROUND

A. Technical Field

The present invention relates generally to root-mean-square (hereinafter, "RMS") detectors, and more particularly, to the implementation of a true RMS detector comprising multiple variable-gain control stages utilizing automatic variable-gain control relating to changes in an input RF signal.

B. Background of the Invention

Various structures and methods are available for the detection and measurement of voltage and/or power on a radio-frequency ("RF") signal. RMS detection is an example of a method for detecting and quantifying a power or voltage level over a complete cycle of a sinusoidal signal. In many instances, RMS detection is preferred over peak detection because it is a more accurate measurement of the RF power in an alternating current or voltage signal.

RMS detectors function by squaring an input signal, taking an average of the squared signal over a period of time on the signal, and then square-rooting this average. FIG. 1 illustrates an exemplary prior art RMS detector, which detects an RMS voltage of an incoming signal. The incoming signal 110 is received at an input on a voltage squarer 120 that squares the signal 110. Depending on the design of the detector, the squarer 120 may also scale the signal by a scaling factor (K) and generate an output voltage ($V_1$) 125. It is important to note that the voltage swings on the output voltage ($V_1$) 125 are related to the squared value of the voltage swings on the input signal 110 as shown below.

$$V_1 = K V_i^2$$

Because of the squaring function of the squarer 120, voltage variations on the input signal 110 are greatly amplified and may result in very large variations in the squarer output voltage ($V_1$) 125. These large voltage variations on the squarer output voltage ($V_1$) 125 may create significant noise offset issues on the low end of the signal and overload problems on the top end of the signal. Accordingly, a squarer may be forced to operate outside of its squaring region, which could effectively clip the output voltage 125 at the high end of the signal as well as cause the squarer to lose its squaring functionality and generate distortion on the squared signal in response to certain input signals and modulation schemes.

The squarer output voltage ($V_1$) 125, and the distortions therein, are provided to an RC circuit 130 that averages this output voltage 125 over a particular cycle of the signal. This averaged or mean value ($V_2$) 135 of the squarer output voltage ($V_1$) 125 is shown below:

$$V_2 = K \overline{V_i^2}$$

This mean value ($V_2$) 135 is provided as a first input on a gain block 140 that is coupled across a square-rooter 150. The output ($V_3$) 155 of the square-rooter 150 is provided as a second input on the gain block 140. This gain block 140 effectively forces the square-rooter output ($V_3$) 155 to be equal to the mean value ($V_2$) 135. Accordingly, this output ($V_3$) 155 on the square-rooter 150 is defined as:

$$V_3 = K V_o^2 = V_2 = K \overline{V_i^2}$$

This relationship between the square-rooter output ($V_3$) 155 and the mean value ($V_2$) 135 results in an output of the gain blocker 140 being the RMS value of the input signal 110 and defined as:

$$V_o = \sqrt{\overline{V_i^2}}$$

As discussed above, the RMS detector in FIG. 1 is limited in the types of signals that it can properly process. This limitation prevents this type of RMS detector from properly functioning in certain types of communication systems that use modulation schemes that generate large peak-to-average ratios on the signal.

Accordingly, what is needed is an RMS detector that is able to function within more diverse types of communication systems including those systems that employ modulation schemes that generate large peak-to-average ratios on a signal.

SUMMARY OF THE INVENTION

Embodiments of the present invention provide systems, devices and methods for detecting the RMS value of a voltage or current signal. The RMS detector uses multiple variable-gain stages and internal gain control to generate an RMS voltage or current output related to an RF signal input. This RMS detector significantly reduces the voltage or current swings seen on a squarer within prior art RMS detectors and reduces the detector's dependency on noise offsets at low signal levels and overload distortion at high signal levels. These embodiments of the present invention effectively improve the accuracy of the RMS detector within large dynamic signal ranges by obviating the operation of a squarer in saturation or outside of its squaring region and avoiding distortions caused thereby. Accordingly, embodiments of the present invention are able to more accurately detect RMS values on a signal, operate over relatively higher voltage or current ranges, and function accurately within a diverse set of signal modulation schemes.

In certain embodiments of the invention, an RF signal is provided to an RF variable-gain amplifier that applies a variable gain to the RF signal that forces an output to be constant or approximately constant. This constant output may be amplified so that the resulting signal falls within a preferred squaring region of a squarer, which squares the output. The squared output is averaged over a period of time resulting in an averaged, squared output that is also forced to be constant. A gain block forces this averaged, squared output to be equal to a reference voltage by generating an output that is used to define a first gain adjustment on the RF variable-gain amplifier, which effectively creates a feedback loop that changes the gain on the RF variable-gain amplifier relative to voltage changes on the RF signal.

A second gain adjustment is generated from the output on the gain block that controls the gain across a DC variable-gain amplifier. This second gain adjustment also relates to signal level changes on the RF signal. The DC variable-gain amplifier output is also forced to be a constant by this second gain adjustment and is provided on an input of a second gain block. The second gain block forces the output on the DC variable-gain amplifier to be equal to a reference voltage by outputting a signal on a feedback loop that is provided on an input of the DC variable-gain amplifier. This output from the second gain block is proportional to an RMS voltage of the RF signal and may be scaled, in certain embodiments of the invention, to identify the true RMS voltage of the RF signal.

In other embodiments of the invention, an RMS detector uses current operations that define the same gain adjustment signals on an RF variable-gain amplifier and a DC variable-gain amplifier to generate a signal from which a true RMS voltage may be defined. In these embodiments, the large signal swings in the squarer are significantly reduced by forcing the signal levels at the outputs of the variable-gain amplifiers, squarer and averager to constant values, even though the RF input signal level may take on a wide range of values.

In yet other embodiments of the invention, components and modules within embodiments of the RMS detector comprise novel and non-obvious structures and functionality that improves the performance and operation thereof.

Certain features and advantages of the present invention have been generally described in this summary section; however, additional features, advantages, and embodiments are presented herein or will be apparent to one of ordinary skill in the art in view of the drawings, specification, and claims hereof. Accordingly, it should be understood that the scope of the invention shall not be limited by the particular embodiments disclosed in this summary section.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

Embodiments of the present invention provide systems, devices and methods for detecting an RMS voltage or current (and thus the power level) of an input signal. The RMS detector uses multiple variable-gain stages and automatic gain control feedback that varies in relation to voltage or current changes in the input signal. Using this relationship between the input signal and the variable-gain-control feedback, an output on a variable-gain stage is generated that relates to an RMS value of the input signal. This RMS detector significantly reduces the voltage swings seen on a squarer within prior art RMS detectors and reduces the detector's dependency on voltage offsets at low signal levels and overload distortion at high signal levels. The embodiments of the present invention also improve the accuracy of the RMS detector when processing signals which take on a wide range of values by obviating the operation of a squarer in saturation or out of the squaring region. Accordingly, embodiments of the present invention are able to more accurately detect the RMS value of a signal, operate over relatively higher signal ranges, and better function with different signal modulation schemes that may generate signals with large peak-to-average ratios.

In the following description, for purpose of explanation, specific details are set forth in order to provide an understanding of the invention. It will be apparent, however, to one skilled in the art that the invention may be practiced without these details. One skilled in the art will recognize that embodiments of the present invention, some of which are described below, may be incorporated into a number of different electrical components, circuits, devices and systems. The embodiments of the present invention may function in various different types of environments wherein RMS detection is relevant including high-frequency RF applications. Structures and devices shown below in block diagram form are illustrative of exemplary embodiments of the invention and are meant to avoid obscuring the invention. Furthermore, connections between components within the figures are not intended to be limited to direct connections. Rather, connections between these components may be modified, re-formatted or otherwise changed by intermediary components.

Reference in the specification to "one embodiment" or "an embodiment" means that a particular feature, structure, characteristic, or function described in connection with the embodiment is included in at least one embodiment of the invention. The appearances of the phrase "in one embodiment" in various places in the specification are not necessarily all referring to the same embodiment.

Figure 1:
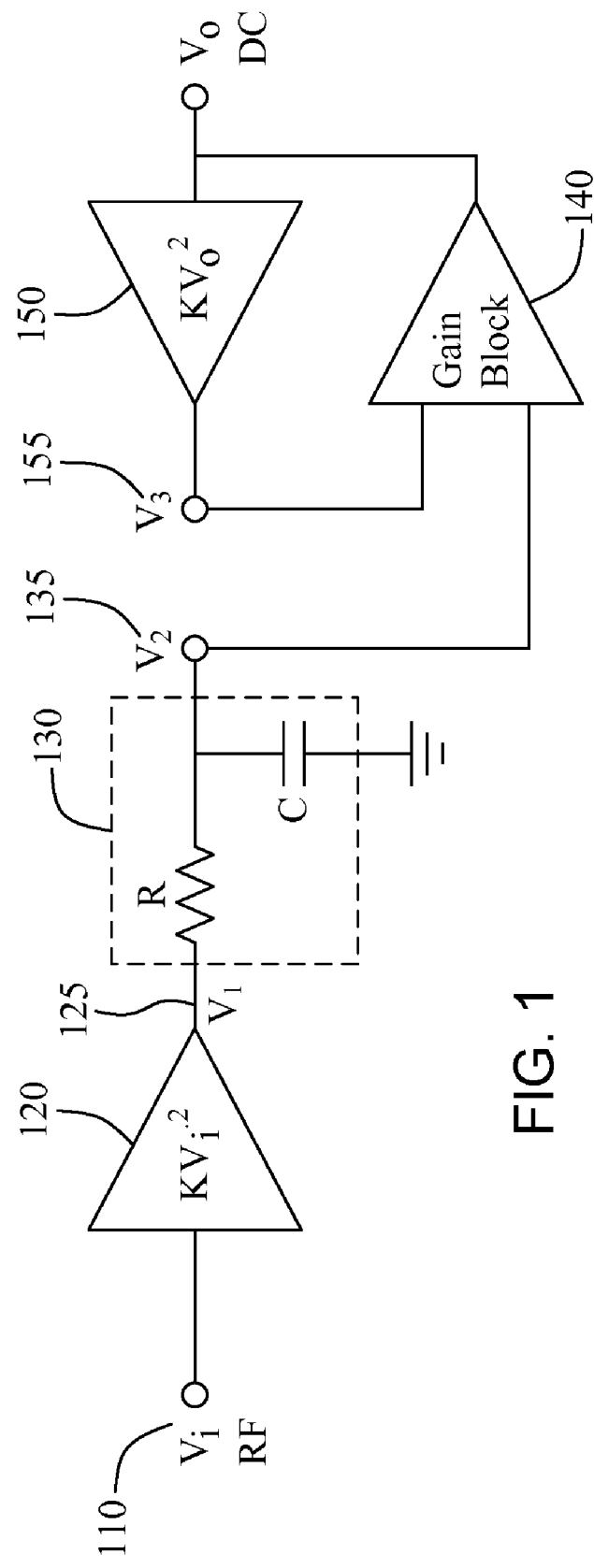
FIG. 1 illustrates a prior art RMS detector in which potentially large voltage or current swings may occur as the input RF signal level takes on a wide range of values.
Figure 2:
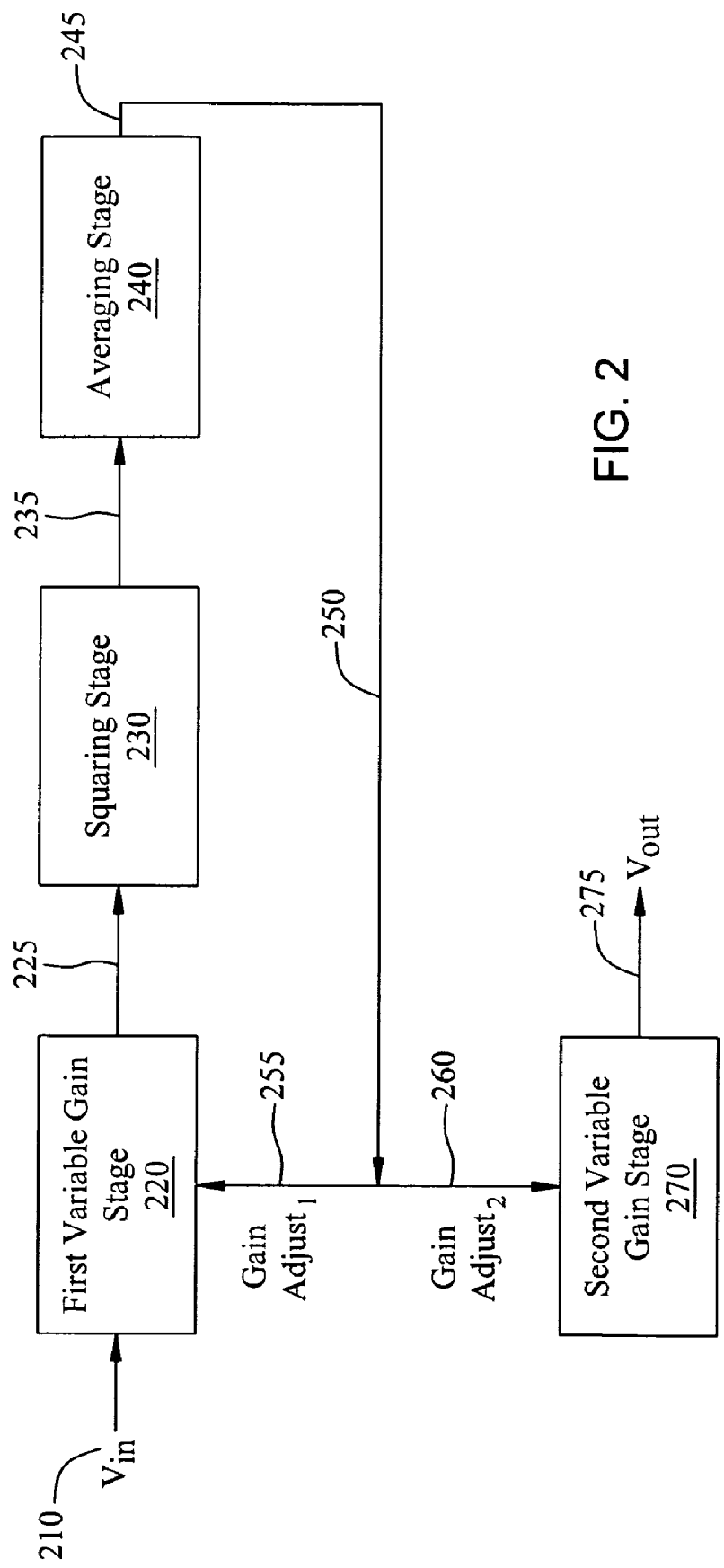
FIG. 2 is a general illustration of an RMS detector according to various embodiments of the invention.

FIG. 2 generally illustrates a multi-stage variable-gain RMS detector in accordance with various embodiments of the invention. An RMS value is generated from an input signal by controlling gain across variable-gain stages relative to amplitude changes in the input signal. In effect, amplitude changes in the input signal result in changes in the gain-control feedback to the variable-gain stages, which allows an RMS voltage for the input signal to be extracted from an output of a variable-gain stage. One skilled in the art will recognize that the functionality recited within FIG. 2 may be realized using various different components and designs, and may also include intermediary components between the modules that modify or otherwise change a signal within the multi-stage variable-gain RMS detector.

Referring to FIG. 2, an input signal 210 is received by a first variable-gain stage 220. In certain embodiments of the invention, this first variable-gain stage 220 comprises a first variable-gain amplifier in which a feedback loop adjusts the gain of this amplifier so that the output 225 of the first variable-gain stage 220 is forced constant or approximately constant (i.e., having relatively small signal level changes for various input signal amplitudes). Hereinafter and within the claims, the term "constant" is intended to include both constant and approximately constant signal levels. Accordingly, as the amplitude of the input signal 210 changes, the first variable-gain stage 220 adjusts the amount of gain in an attempt to keep the output 225 constant.

This output 225 is provided to a squaring stage 230 and is designed to fall within the optimum squaring region of the squaring stage in order to reduce the chance of driving the squaring stage 230 into saturation and out of its squaring range. Because the output 225 of the first variable-gain stage 220 is continually being forced to a constant level, the squaring stage 230 does not experience large voltage swings on its input, which in turn would have generated significantly large voltage swings on its output caused by the squaring operation. Rather, the output of the squaring stage 230 is also constant or approximately constant because its input is relatively constant, which allows the squaring stage 230 to safely operate below saturation. The output 235 on the squaring stage 230 is provided to an averaging stage 240 that once again generates an output 245 that is constant or approximately constant.

The output 245 of the averaging stage is fed back 250 and used, at least partially, to control the gain on the first variable-gain stage 220. One skilled in the art will recognized that intermediary components may be used within this feedback 250 that modifies the feedback signal prior to eventually controlling the gain on the first variable-gain stage 220. Examples of such components are discussed later within the patent application. Using this feedback, a first gain adjustment 255 is generated that modifies the gain of the first variable-gain stage 220 in order to try and force its output 225 to be constant. Stated another way, as the input voltage 210 changes, the feedback responds by changing a first gain adjust signal 255 accordingly in an attempt to force the first variable-gain stage output 225 to a constant level.

A second variable-gain stage 270 is controlled by a second gain adjustment 260, which is also derived from the feedback 250. Similar to the first gain adjustment 255, this second gain adjustment 260 also changes in relation to voltage changes on the input signal 210. Because of the relationship between the second gain adjustment 260 and the input signal 210, the changes in the gain across the second variable-gain stage 270 vary in relation to voltage or current changes within the input signal 210. In particular, changes in gain in the second variable-gain stage 270 are generated in relation to the averaged-squared changes in the input signal 210. Using this relationship, the second variable-gain stage 270 generates an output 275 that relates to an RMS value of input signal 210. This output 275 may subsequently be scaled or otherwise modified, for example by a gain block, to provide an accurate RMS value of the input signal 210.

Figure 3A:
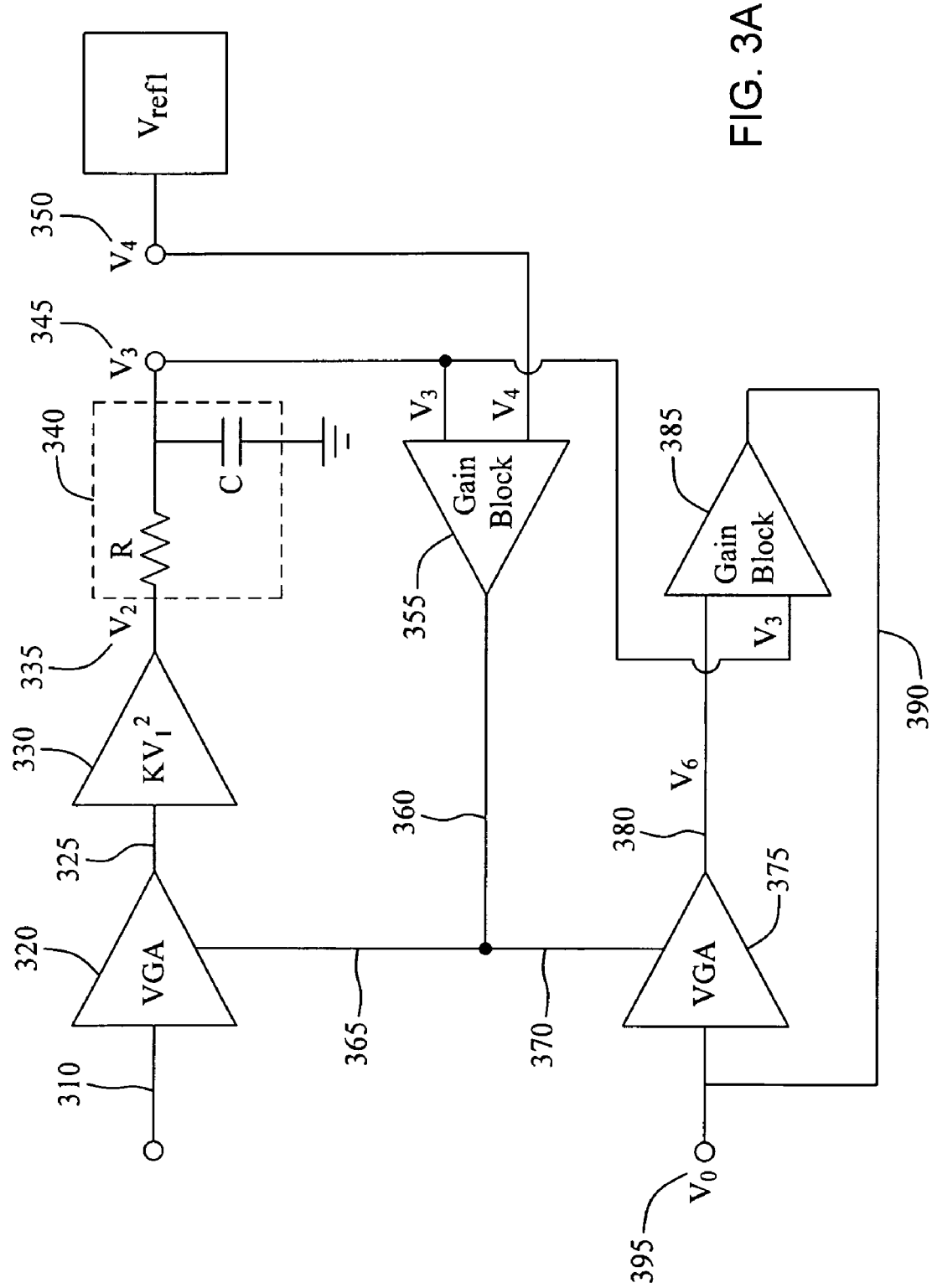
FIG. 3A is a block diagram of an RMS voltage detector according to various embodiments of the invention.
Figure 3B:
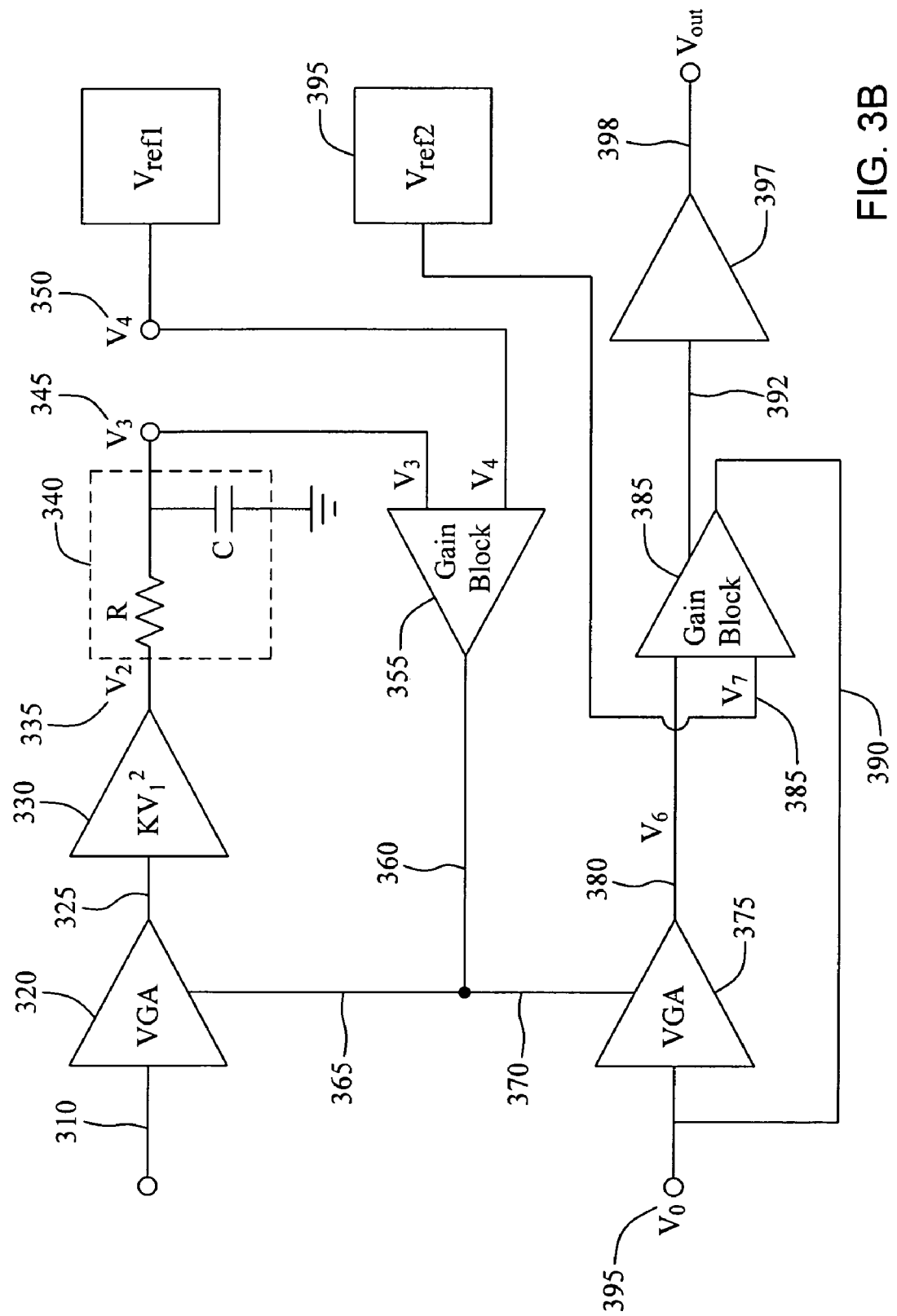
FIG. 3B is a block diagram of another RMS voltage detector according to various other embodiments of the invention.

One skilled in the art will recognize that numerous different circuit implementations may be used in which internal gain control feedback is used to control the gain across multiple variable-gain stages in relation to changes within an input signal, and using this relationship generate an RMS value for the input signal. FIGS. 3A and 3B illustrate voltage-based examples of RMS detectors in accordance with various embodiments of the present invention.

Referring to FIG. 3A, an input signal 310 is received at a first variable-gain amplifier 320 that applies a variable-gain on the input signal 310, which forces an output ($V_1$) 325 to be constant. As the voltage level on the input signal 310 changes, the gain of the first variable-gain amplifier 320 will change in response thereto. This constant output 325 is received at a squarer 330 that performs a squaring operation. Because the output ($V_1$) 325 on the first variable-gain amplifier 320 is constant or approximately constant, the voltage changes on the output ($V_2$) 335 of the squarer 330 caused by changes in the input RF signal level are significantly reduced, which allows the squarer to operate within its squaring region. Accordingly, the output ($V_2$) on the squarer 330 is equal to:

$$V_2 = KV_1^2 = KG_v^2 V_i^2$$

where $G_v$ is the gain of the RF variable-gain amplifier.

The squared output ($V_2$) 335 is provided to an RC circuit 340 that effectively averages the squared output 335 over a particular time period. In certain embodiments of the invention, this averaging occurs over a full wavelength cycle of the input signal 310. An averaged squared output ($V_3$) 345 is generated from the RC circuit 340 and defined as:

$$V_3 = \overline{V_2} = K\overline{V_1^2} = KG_v^2 \overline{V_i^2}$$

and thus $$G_v = \left(\frac{\sqrt{V_3}}{\sqrt{K}}\right)\left(\frac{1}{\sqrt{\overline{V_i^2}}}\right)$$

This averaged squared output ($V_3$) 345 is provided to a first input on a gain block 355. The gain block 355 also receives a reference voltage 350 on a second input 350. This reference voltage 350 may be generated on-chip or from an external source. The gain block 355 generates an output feedback signal 360 that attempts to force the reference voltage 350 and the averaged squared output 345 to be equal or approximately equal. Thus, $$V_3 = V_4 = V_{ref1}$$

and $$G_v = \left(\frac{\sqrt{V_{ref1}}}{\sqrt{K}}\right)\left(\frac{1}{\sqrt{\overline{V_i^2}}}\right)$$

The feedback signal is used to generate a first gain adjustment 365 on the first variable-gain amplifier 320. Accordingly, voltage changes in the input signal 310 are effectively cycled through the squarer 330, RC circuit 340, and gain block 355 in such a manner that large voltage swings on these components are not generated, but changes within the input signal 310 are accounted for within the feedback signal 360 and eventually used to extract an associated RMS value.

A second variable-gain amplifier 375 is used to extract this RMS value such that a second gain adjustment 370 is derived from the feedback signal 360 and controls the gain across this second variable-gain amplifier 375. The second variable-gain amplifier 375 generates an output ($V_6$) 380 that is provided on a first input of a second gain block 385 and if the first and second variable gain amplifiers are matched, then:

$$V_6 = G_v V_o$$

The averaged squared output ($V_3$) 345 is provided on a second input of the second gain block 385, which forces the second variable-gain amplifier output ($V_6$) 380 to equal or approximately equal the averaged squared output ($V_3$) 345. Thus, $V_6 = V_3 = V_{ref1}$. In so doing, the second gain block 385 outputs a signal ($V_o$) 390 that is representative of the RMS value of the input signal 310 and which is provided as an input on the second variable-gain amplifier 375. The output signal ($V_o$) is given by:

$$V_o = \frac{V_6}{G_v} = \frac{V_{ref1}}{G_v} = \sqrt{KV_{ref1}}\sqrt{V_i^2}$$

Depending on the implementation, this output signal ($V_o$) 390 may be scaled or otherwise modified to obtain an accurate measurement of the RMS value of the input signal 310.

One skilled in the art will recognize that the second input on the second gain block 385 does not necessarily need to be the averaged squared output ($V_3$) 345; rather, any constant voltage may be provided thereon to force the output ($V_6$) 380 of the second variable-gain amplifier 375 to a constant level. In this scenario, a gain or scalar may be applied to the output signal 390 to adjust its level in relation to the applied constant voltage on the second input of the second gain block 385 and the averaged squared output ($V_3$) 345. FIG. 3B illustrates an example of such a scenario according to various embodiments of the invention.

Referring to FIG. 3B, a second reference voltage ($V_7$) 395 is applied to the second input of the second gain block 385 instead of the averaged squared output ($V_3$) 345. This second reference voltage 395 has a known value and its relation to the averaged squared output ($V_3$) 345 may be determined. The output 392 from second gain block 385 still represents the RMS voltage of the input signal 310, but may differ by a scaling factor. This scaling factor may be identified based on the transfer function of the squarer (K) by introducing quantity $V_{ref2}$ defined as:

$$K = \frac{1}{V_{ref2}}$$

and thus, $$V_o = \sqrt{\frac{V_{ref1}}{V_{ref2}}}\sqrt{V_i^2}$$

This scaling factor may be identified by the relationship between the second reference voltage 395 and the averaged squared output ($V_3$) 345 or the first reference voltage ($V_4$) 350. Accordingly, a gain may be applied to this output signal ($V_o$) 390 by amplifier 397 to generate an accurate RMS value 398 for the input signal 310.

This output ($V_o$) contains less distortion and error than seen on prior art RMS detectors because the squarer was able to exclusively operate within its squaring region and avoid saturation for large RF inputs and noise-related problems for small RF inputs. In particular, by avoiding the large signal level ranges generated in the prior art, the RMS detector discussed above is able to more efficiently and accurately generate an RMS value for an input signal, especially those input signals having large peak-to-average ratios.

Figure 4:
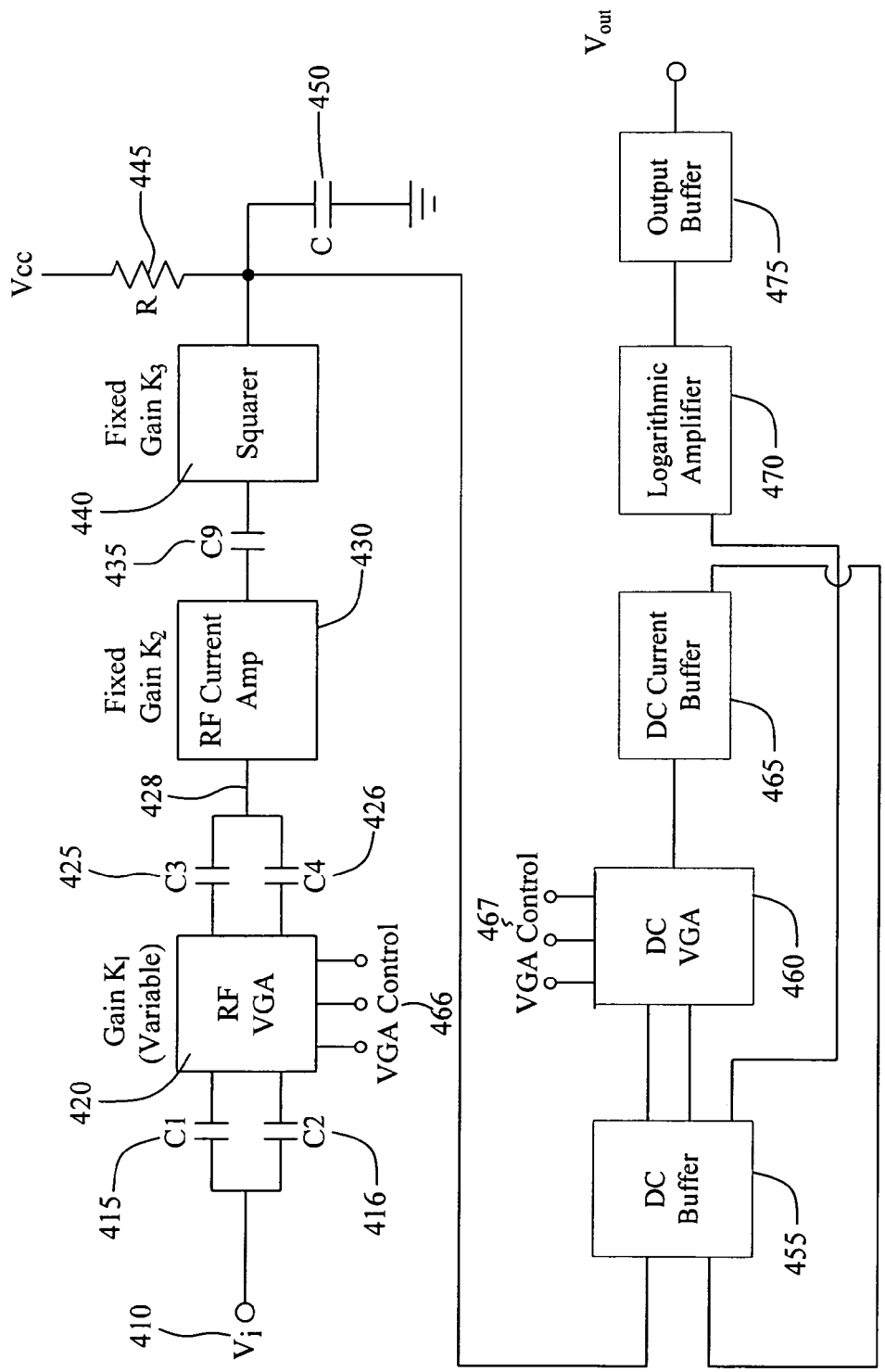
FIG. 4 illustrates an exemplary RMS detector architecture according to various embodiments of the invention.

FIG. 4 illustrates an exemplary RMS detector architecture comprising an RF variable-gain amplifier, DC variable-gain amplifier, and other components according to various embodiments of the invention. An RF input 410 receives an RF signal at an RF variable-gain amplifier 420 via AC coupling capacitors 415, 416. In various embodiments, the variable-gain amplifier 420 comprises differential pair variable-gain circuits that apply a varying gain to force an output to be constant. These differential-pair variable-gain circuits are AC-coupled via coupling capacitors 425, 426 to an output 428 that sums the current from these differential-pair variable-gain paths.

In certain embodiments, an RF current amplifier 430 applies a fixed gain to the current output 428 and provides the amplified signal to a squarer 435 via coupling capacitor 435. This fixed gain adjusts the current output 428 so that the signal falls within an optimum squaring region of the squarer 430. The squarer 440 squares the signal by applying a non-linear gain to the signal and provides the squared signal to an RC circuit that effectively averages the signal over a particular time period.

The RC circuit comprises a resistor 445 coupled to a voltage source (Vcc) and a capacitor 450 coupled to ground. The resulting averaged, squared signal is fed back, via a feedback loop, to control the gain across the RF variable-gain amplifier 420. Control circuitry 466 is provided to appropriately control the variable-gain and process the feedback information.

A DC variable-gain amplifier 460 is also coupled to control circuitry 467 that may or may not be integrated within the control circuitry controlling the gain of the RF variable-gain amplifier 420. The DC variable-gain amplifier 460 forces its output to be constant or approximately constant and buffers the output in a DC current buffer 465. In certain embodiments of the invention, an output on the DC current buffer 465 is transmitted on a feedback loop to DC buffer 455, which provides the feedback on an input of the DC variable-gain amplifier 460. The output on the DC buffer 455 may also be an output representative of an RMS voltage of the input RF signal ($V_i$) 410.

In various other embodiments, a true RMS value in dB may also be provided such that the output on the DC buffer 455 is provided to a logarithmic amplifier 470 and a buffer 475. Depending on the design of the detector, this output may be further scaled to generate a true RMS value since the output on the buffer 475 is proportional to the RMS value on a dB scale.

Figure 5:
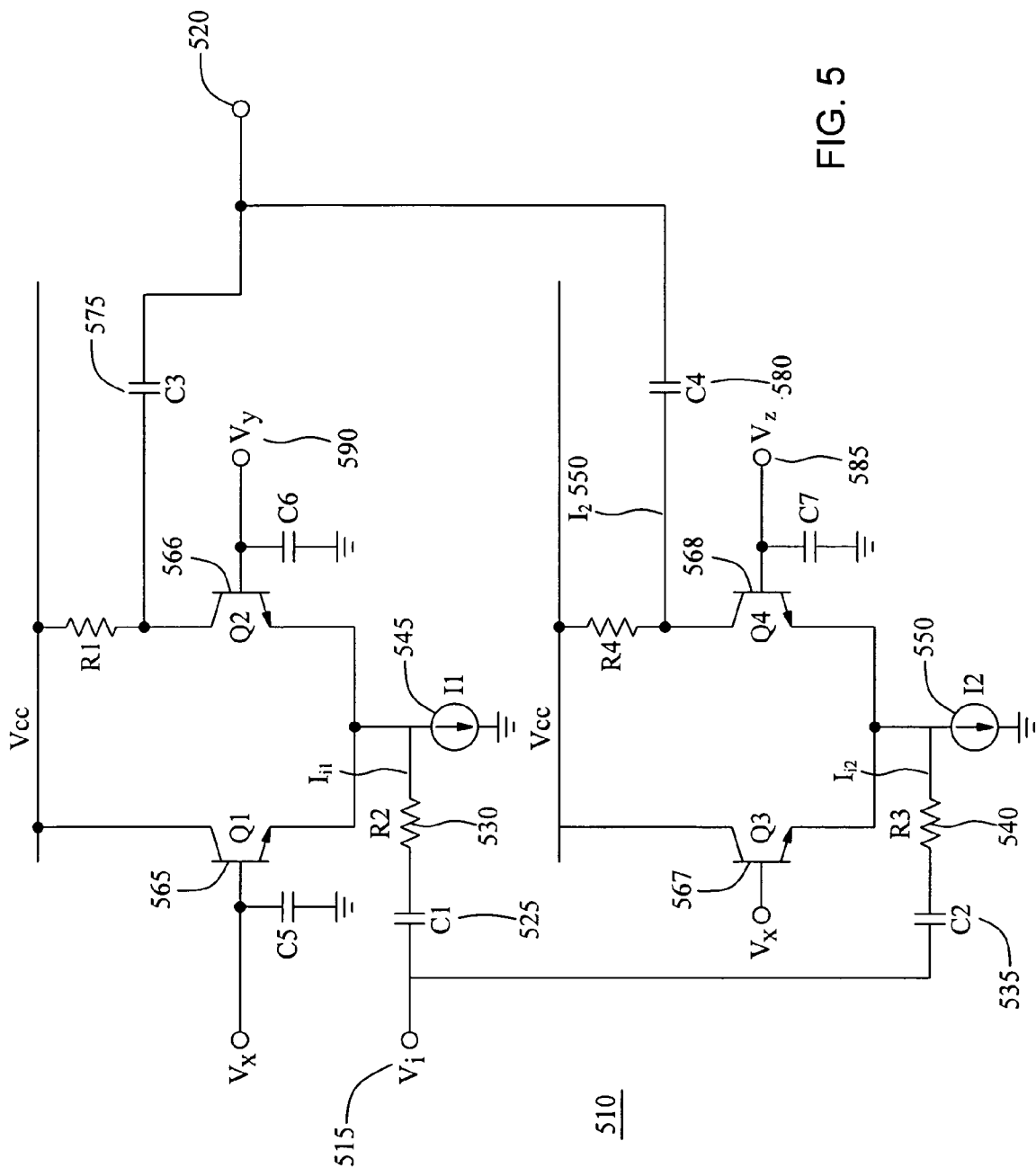
FIG. 5 is a circuit diagram of a variable-gain amplifier in accordance with various embodiments of the invention.

FIG. 5 illustrates a RF variable-gain amplifier according to various embodiments of the invention. The RF variable-gain amplifier 510 receives an RF signal at input 515 and generates a current output 520 that is provided to a fixed-gain current amplifier 610. The RF input 515 is AC-coupled on chip through capacitor ($C_1$) 525 to resistor ($R_2$) 530, and through capacitor ($C_2$) 535 to resistor ($R_3$) 540. These capacitor-resistor pairs effectively convert the incoming RF signal to a first AC current $I_{i1}$ and second AC current $I_{i2}$.

The first AC current $I_{i1}$ is defined as:

$$I_{i1} = \frac{V_i}{R_2 + Z_{i1}}$$

The second AC current $I_{i2}$ is defined as:

$$I_{i2} = \frac{V_i}{R_3 + Z_{i2}}$$

The first AC current $I_{i1}$ is provided to the common emitter point of parallel transistors $Q_1$ 565 and $Q_2$ 566. The impedance at this common emitter point is relatively low and defined as $Z_{i1}$. The second AC current $I_{i2}$ is provided to the common emitter point of parallel transistors $Q_3$ 567 and $Q_4$ 568. The impedance at this emitter point is also relatively low and defined as $Z_{i2}$. These two sets of transistors define parallel differential-pair variable-gain circuits with the first AC current $I_{i1}$ and the second AC current $I_{i2}$ being subject to gain control by the transistor pairs $Q_1$-$Q_2$ and $Q_3$-$Q_4$. The output AC currents of the differential pair variable-gain circuits are AC-coupled to the output 520 by capacitors $C_3$ 575 and $C_4$ 580.

For large RF inputs, $V_z$ 585 is low, the transistor $Q_4$ 568 is off. The large RF input voltage causes a large current through resistor $R_2$ 530. At this input level, $V_y$ 590 turns transistor $Q_2$ 566 partially on and $Q_2$ 566 delivers RF current to the output 520.

As the voltage on the input $V_i$ 515 decreases, $V_y$ 590 diverts more current through transistor $Q_2$ 566 until it is fully on and transistor $Q_1$ 565 is off. As the input level at $V_i$ 515 further decreases, $V_z$ 585 progressively turns on transistor $Q_4$ 568 to hold the output AC current constant as the input voltage peak decreases. The outputs from both variable-gain stages are summed as currents via capacitive coupling to the output 520 of the first stage 510 and, in certain embodiments, fed to a fixed-gain, current amplifier.

The gain values of the variable-gain stages are controlled by variable-gain control circuitry that adjusts these gain values relative to voltage changes in the input signal ($V_i$) 515. This control circuitry and feedback loop will be discussed in greater detail later within the disclosure.

Figure 6:
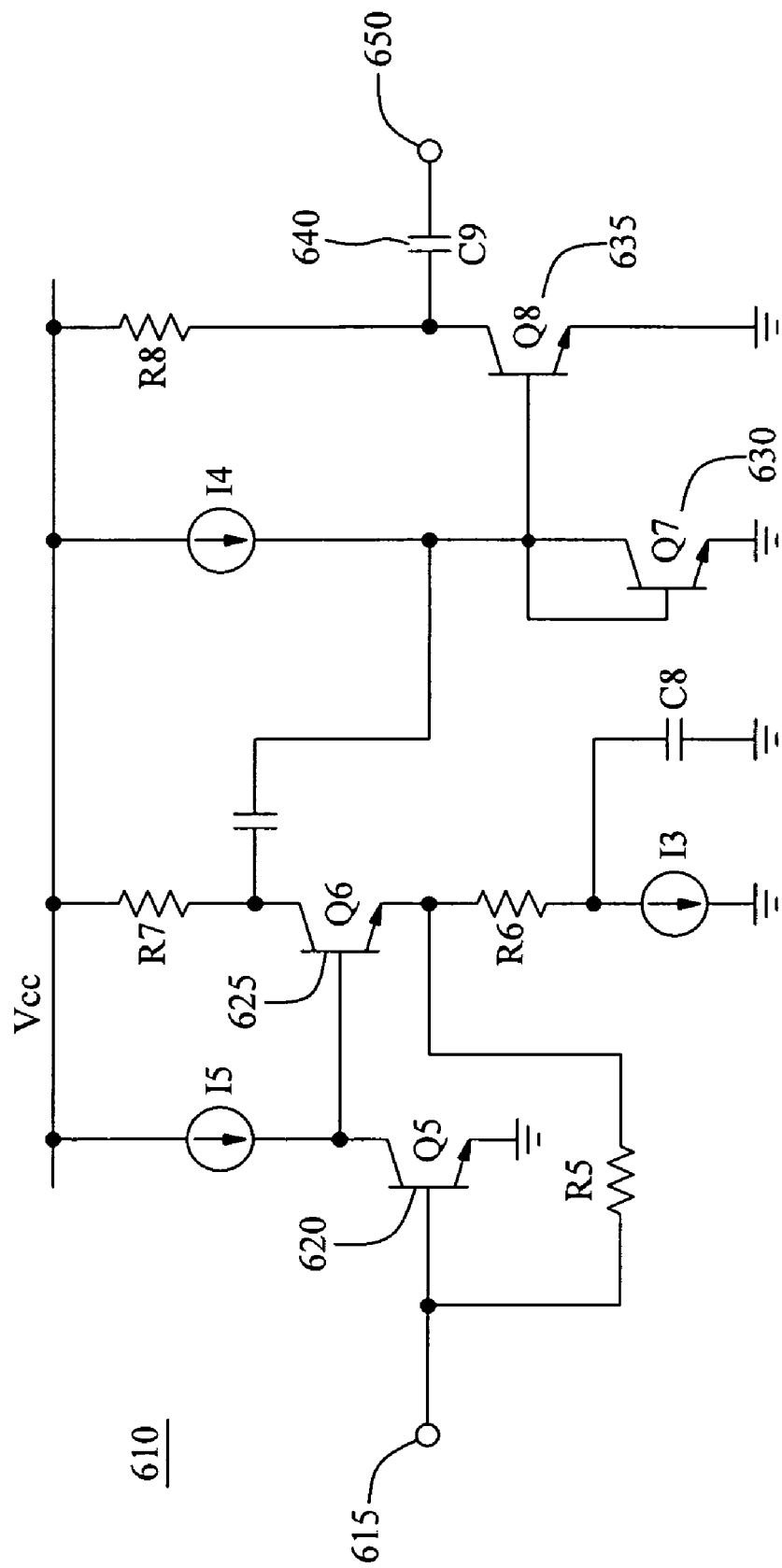
FIG. 6 is a circuit diagram of a fixed-gain amplifier in accordance with various embodiments of the invention.

FIG. 6 illustrates a fixed-gain, current amplifier 610 according to various embodiments of the invention. An input 615 receives a constant amplitude current from the variable-gain amplifier 510. This current is amplified by a particular constant gain so that it falls within an optimum squaring region when provided to the squarer.

In various embodiments of the invention, the amplifier is a 2-stage design with a current feedback pair with a particular gain followed by a simple mirror gain. The mid-band current gain of the current feedback pair of the transistor $Q_5$ 620 and the transistor $Q_6$ 625 is defined as:

$$\frac{i_{c6}}{i_i} = 1 + \frac{R_5}{R_6}$$

The input impedance at the transistor $Q_5$ 620 base is very low due to the shunt feedback, such that:

$$|Z_i| \approx \frac{R_5 + \frac{1}{G_{m6}} \| R_6}{G_{m5} Z_{l5}}$$

where $Z_{l5}$ is the load impedance seen by $Q_5$.

The feedback may be designed such that the capacitance from $Q_5$ collector to ground is small resulting in a feedback gain, $A_1$, around the amplifier of:

$$A_1 \approx G_{m5} Z_{l5} \frac{G_{m6} R_{e6}}{1 + G_{m6} R_{e6}} = 1$$

at the unity gain frequency of the loop gain.

The gain ($i_{c6}/i_i$) has a –3 dB frequency which is the unity gain frequency of the loop gain. The current output from transistor $Q_6$ 625 is AC-coupled to the current mirror comprised of transistor $Q_7$ 630 and transistor $Q_8$ 635. The output current 650 from transistor $Q_8$ 635 is AC-coupled, via coupling capacitor $C_9$ 640, to the squarer. This output current 650 has a fixed gain in relation to the input current 615 of the amplifier.

Figure 7:
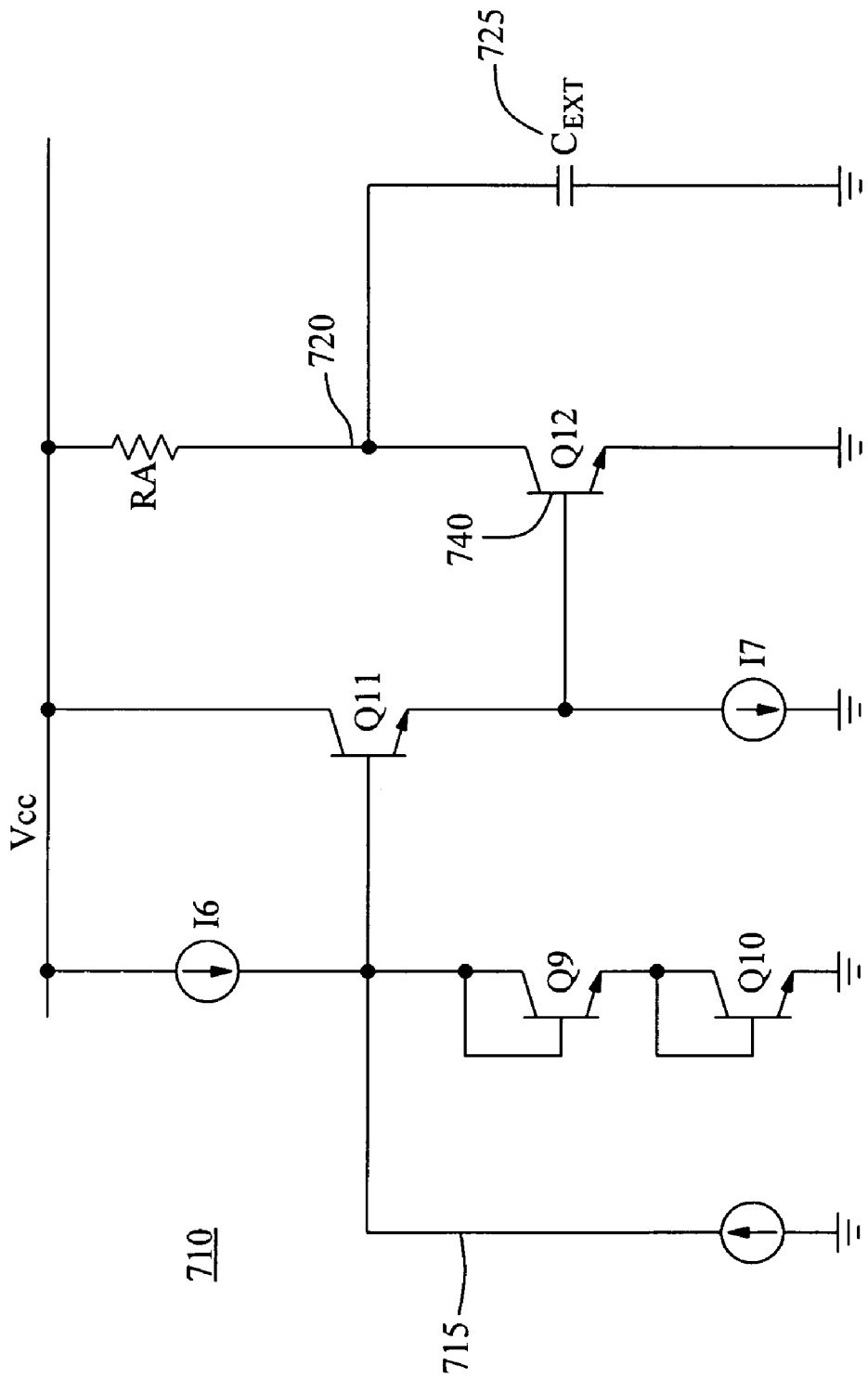
FIG. 7 is an exemplary squarer according to various embodiments of the invention.

FIG. 7 illustrates a squarer 710 in accordance with various embodiments of the invention. An input 715 on the squarer 710 receives the output current 650 from the current amplifier, squares this signal, and transmits the squared signal on an output 720 having an AC-bypass capacitor 725.

The squarer 710 has a preferred or optimum squaring region that defines a signal range at which it best functions. If the input signal falls outside of this range, then the squaring function may not accurately square the signal or generate distortion of the squared output signal. For example, if the input current signal is larger than an upper boundary of this optimum squaring region, the squarer may saturate and clip an amplified signal therein.

The squaring function of the squarer 710 is defined by:

$$I_{c9} I_{c10} = I_{c11} I_{c12}$$

such that, $$I_{c12} = \frac{I_{c9}^2}{I_7} = \frac{(I_6 + i_{c8})^2}{I_7}$$

where $i_{c8}$ is the RF current in $Q_8$ and output current 650 from the amplifier 610. This output current 650 may be defined as:

$$i_{c8} = I_m \sin \omega t$$

For illustrative purposes only, assume that the output current 650 has 100 µA peak amplitude for sine wave input such that $I_m = 100$ µA and that $I_6 = I_7 = 200$ µA. Accordingly, $I_{c12}$ may be defined as $$I_{c12} = 200 \text{ µA} + 2i_{c8} + \frac{i_{c8}^2}{200 \text{ µA}}$$

$$I_{c12} = 200 \text{ µA} + 200 \text{ µA } \sin\omega t + 50 \text{ µA } \sin^2 \omega t$$

$$I_{c12} = 200 \text{ µA} + 200 \text{ µA } \sin\omega t + 25 \text{ µA} - 25 \text{ µA } \cos 2\omega t$$

One skilled in the art will recognize that the mean square signal in $I_{c12}$ due to the RF input is 25 µA for $i_{c8} = 100$ µA sin $\omega t$ and the DC bias is 200 µA. The RF components of the squared signal are removed by a large external capacitor 725 in order to provide a constant DC output voltage. This output voltage 720 is forced to be equal to a known reference voltage by the overall feedback loop operating though the RF variable-gain amplifier, RF current amplifier and squarer.

One skilled in that art will recognize that with $I_6 = I_7 = 200$ µA, the value of $I_{c12}$ from $i_{c8} = 100$ µA sin $\omega t$ ranges from 450 µA to 50 µA. Additionally, the value of $I_{c9} = I_{c10}$ ranges from 300 µA to 100 µA. The value of $i_{c8}$ can range up to ±200 µA before overload occurs and transistor $Q_{12}$ 740 saturates. This allows for true square law operation up to 2 times the peak sine wave voltage or 2.8 times the RMS sine voltage of the input, which is equal to 9 dB above the RMS value. It is important to note that $I_6$ may be adjusted in order to improve the yield on the squarer.

Figure 8:
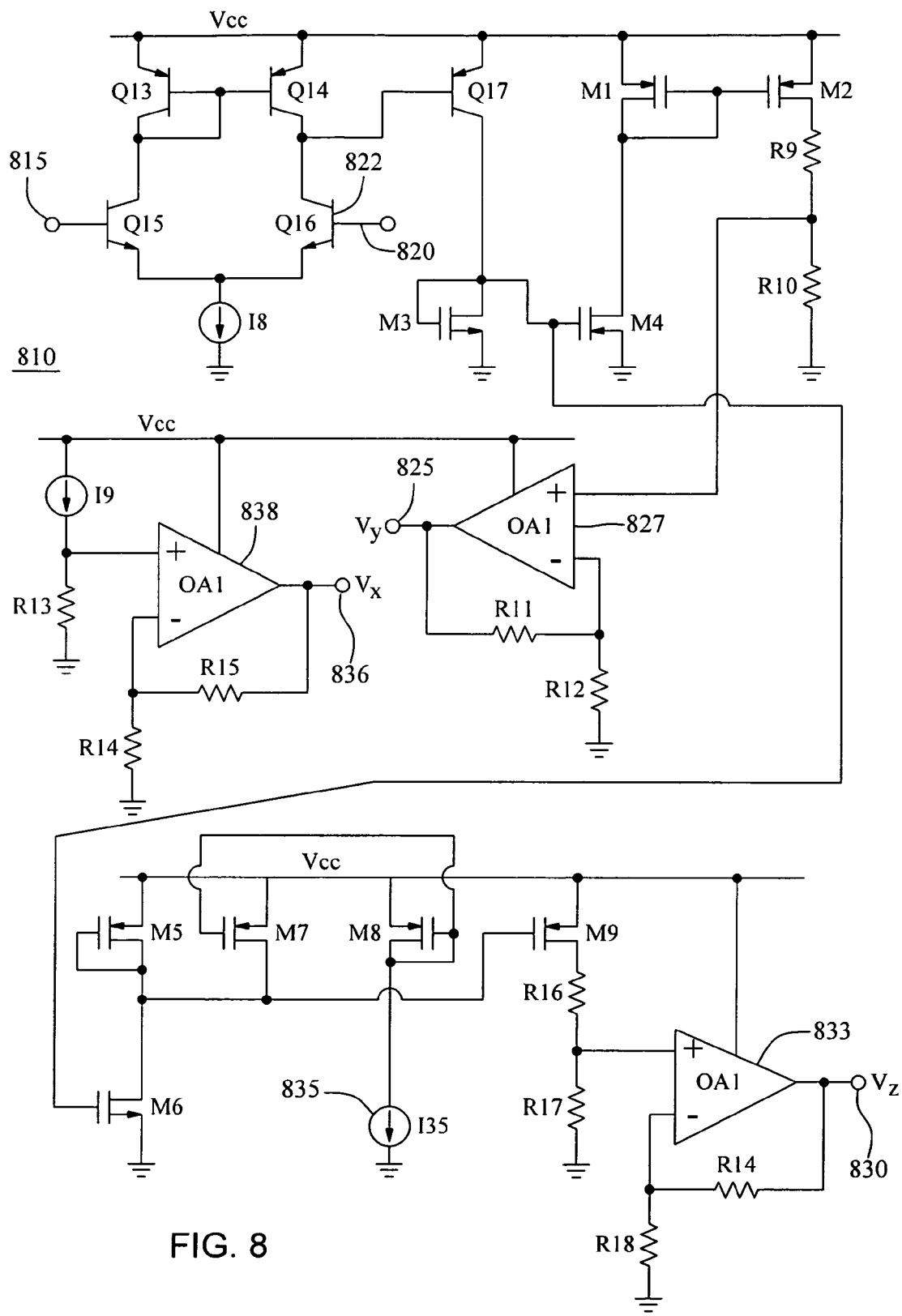
FIG. 8 is a circuit diagram of a control loop for an RM variable-gain amplifier according to various embodiments of the invention.

FIG. 8 is an exemplary variable-gain control loop according to various embodiments of the invention. The variable-gain control loop 810 provides feedback information to the variable-gain amplifier to control the gain applied on the RF input signal to force its output to a constant. In certain embodiments of the invention, an input 815 in the control loop 810 receives the averaged, squared signal from the RC circuit so that a gain adjustment or adjustments may be generated by the control loop.

The voltage on the input 815 is compared with a reference voltage 820 on transistor $Q_{16}$ 822. This comparison generates a first control voltage 825 on an output of a first amplifier 827. The comparison also generates a second control voltage 830 on an output of a second amplifier 833. A DC reference voltage 836 at an output of a third amplifier 838 is applied to the base of transistor $Q_1$ 565 in the variable-gain amplifier 510. This DC reference 835 is also applied to the base of transistor $Q_3$ 567 in the variable-gain amplifier 510.

The first control voltage 825 ranges from zero volts when the transistor $Q_2$ 566, in the variable-gain amplifier 510, is off and to an upper voltage value when $Q_2$ 566 is fully on and $Q_1$ 565 is off. The second control voltage 830 drives the base of the transistor $Q_4$ 568 and is controlled by the control loop with a delay caused by $I_{35}$ 835 until the first control voltage 825 is high.

The values of the first control voltage 825 and the second control voltage 830 will thus change in relation to amplitude changes on the RF signal, which are effectively transferred through the RF variable-gain amplifier 510 and the squarer 710. These control voltages are coupled to the RF variable-gain amplifier 510 in order to change its variable gain in a continual effort to force the output of the RF variable-gain amplifier to a constant value. This feedback control loop operates as follows:

If the DC output voltage 815 of the squarer is not equal to the reference voltage 820, the circuitry of FIG. 8 generates appropriate control voltages $V_y$ 825 and $V_z$ 830, which vary the gain of the RF variable-gain amplifier such that the RF signal delivered to the squarer is of the correct amplitude to force voltage 815 to equal voltage 820. Note that a 2-stage variable-gain amplifier is described to facilitate the design of the circuit for very high-frequency input signals. However, a one-stage variable-gain amplifier could also be used in other embodiments of the invention.

In various other embodiments of the invention, the first control voltage 825, the second control voltage 830 and the DC reference voltage 835 are also provided to the second variable-gain amplifier stage 270, such as the matching DC variable-gain amplifier that is discussed later.

Figure 9A:
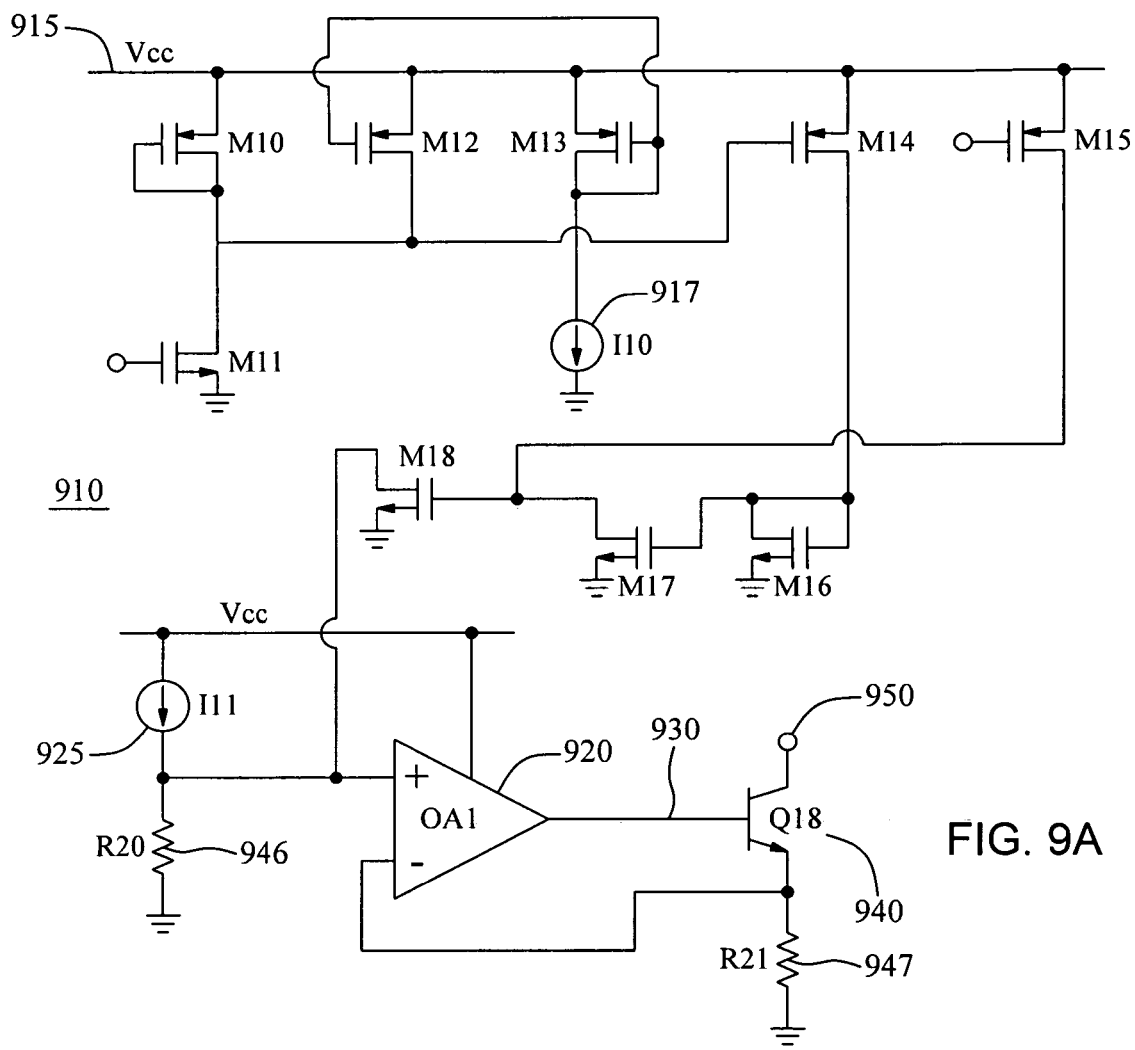
FIGS. 9A and 9B are circuit diagrams of exemplary current sources that may be used within an RF variable-gain amplifier according to various embodiments of the invention.
Figure 9B:
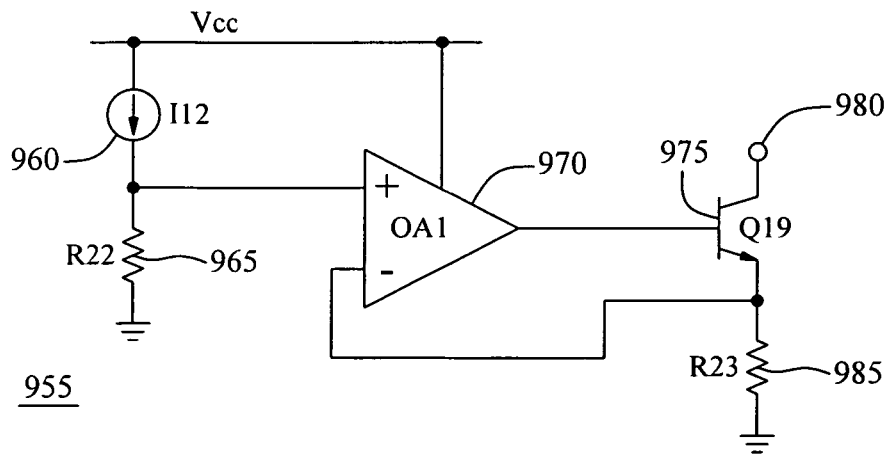

FIGS. 9A and 9B illustrate exemplary circuit designs for current sources that may be implemented within the RF variable-gain amplifier discussed in FIG. 5. Referring to FIG. 9A, a voltage source ($V_{cc}$) 915 is coupled to a plurality of MOS transistors ($M_{10}$-$M_{15}$) that are coupled through another set of MOS transistors ($M_{16}$-$M_{18}$). A first amplifier 920 is coupled to an output of this set of MOS transistors ($M_{16}$-$M_{18}$) and receives current $I_{11}$ 925 such that is drives an output 930 on the operational amplifier 920.

This output 930 is coupled to the base of transistor $Q_{18}$ 940, which generates a current in the transistor collector 950. This collector 950 is coupled to the emitters on transistor $Q_3$ 567 and transistor $Q_4$ 568 to provide a current source thereto resulting in current source $I_1$ 545. The amount of current delivered to these transistors is determined by a first resistor $R_{20}$ 946 and a second resistor $R_{21}$ 947, which effectively determine the voltage on the inputs of the first amplifier 920. The current delivered to the collector of transistor $Q_{18}$ 940 is set by the current $I_{11}$ 925 and the two resistors 946, 947.

FIG. 9B illustrates a fixed current source 955 according to various embodiments of the invention. In certain embodiments, this current source 955 biases the low-gain variable-gain amplifier path. As shown in this figure, the amount of current delivered by the current source may be changed by adjusting the resistors, which in turn changes the amount of current delivered into the amplifier.

In various embodiments of the invention, the resistance of $R_{22}$ 965 defines the voltage applied to amplifier (OA1) 970. The amplifier 970 outputs a signal to the base of transistor $Q_{19}$ 975 that has its emitter coupled to resistor $R_{23}$ 985. An output current 980 is provided on the collector of the transistor $Q_{19}$ 975 and provided to emitter of transistor $Q_1$ 565 and the emitter of transistor $Q_2$ 566 resulting in current source $I_2$ 550.

If the amount of current on $I_2$ 550 is larger than $I_1$ 545, then an increase in linearity margin is achieved in the high-gain path where the drive impedance at the emitters on transistor $Q_3$ 567 and transistor $Q_4$ 568 is smaller for $I_2$ when compared to the impedance at the emitters on transistor $Q_1$ 565 and transistor $Q_2$ 566 for $I_1$.

Figure 10:
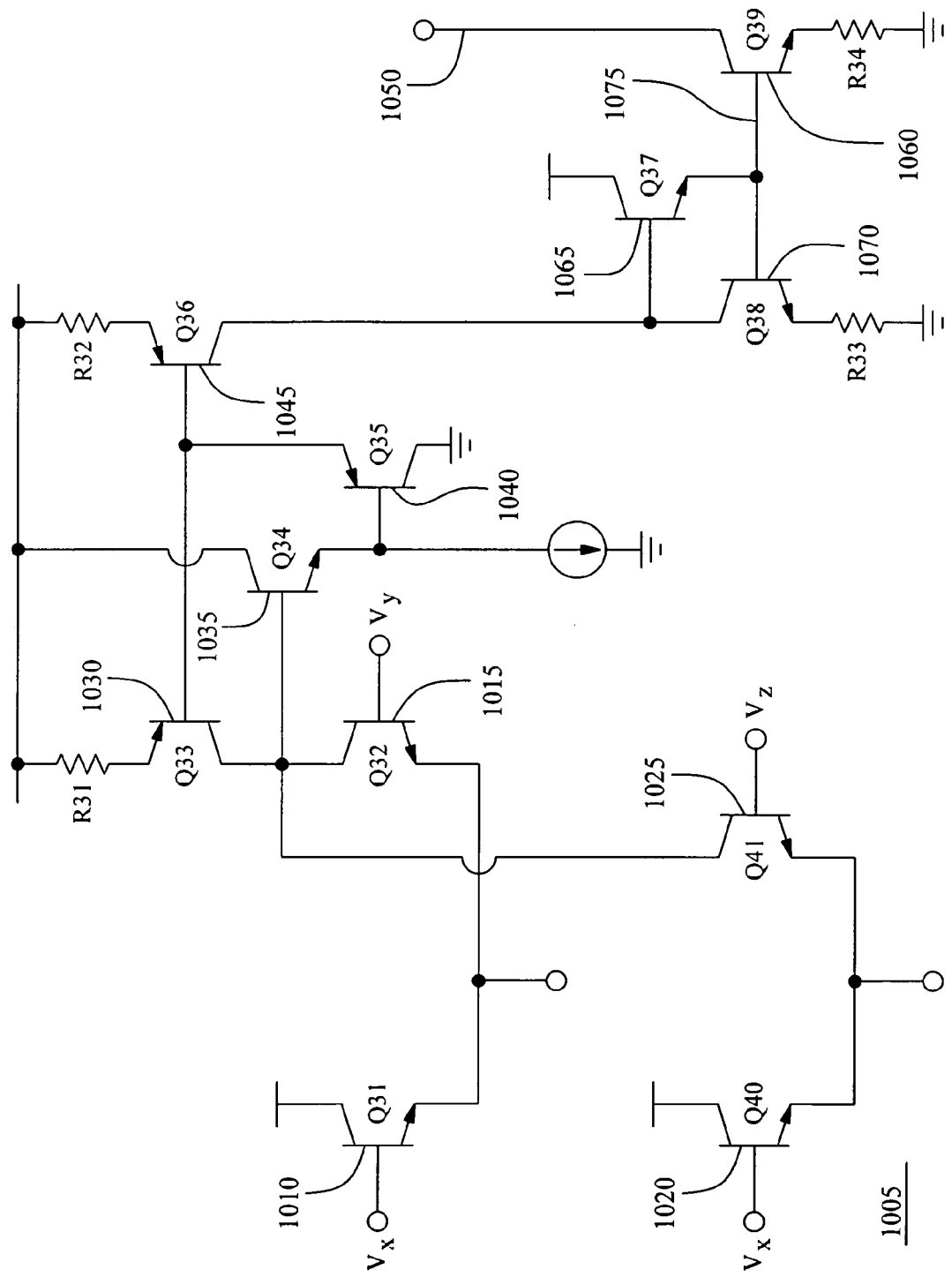
FIG. 10 is a DC variable-gain amplifier in accordance with various embodiments of the invention.

FIG. 10 illustrates a DC variable-gain amplifier in accordance with various embodiments of the invention. The DC variable-gain amplifier 1005 receives a gain adjustment signal from the feedback loop previously discussed. This gain adjustment signal adjusts the gain across the DC variable-gain amplifier 1005 in relation to the voltage on the incoming RF signal to the detector.

The DC variable-gain amplifier 1005 receives DC current from transistor $Q_{24}$ 1140 and transistor $Q_{26}$ 1145, both of which will be described in the disclosure of the DC buffer 1110. These currents from $Q_{24}$ 1140 and $Q_{26}$ 1145 are steered by $V_x$, $V_y$, and $V_z$, as previously discussed, and match the RF variable-gain amplifier current sources with the exception that there is not a DC bias on the current within the DC variable-gain amplifier 1005.

A first transistor differential pair, comprising $Q_{31}$ 1010 and $Q_{32}$ 1015, and a second transistor differential pair, $Q_{40}$ 1020 and $Q_{41}$ 1025, direct the received signal to a current mirror. In various embodiments of the invention, the current mirror comprises $Q_{33}$ 1030, $Q_{34}$ 1035, $Q_{35}$ 1040, and $Q_{36}$ 1045, as shown within FIG. 10. The current signal then passes to another mirror $Q_{38}$ 1070, $Q_{37}$ 1065 and $Q_{39}$ 1060 which provides current gain.

The amplified signal at the collector node 1050 of $Q_{39}$ 1060 is then fed to a DC buffer. This forms a feedback loop that forces $Q_{39}$ 1060 to operate at a constant current that matches the rectified DC output 720 of the squarer 710.

Figure 11:
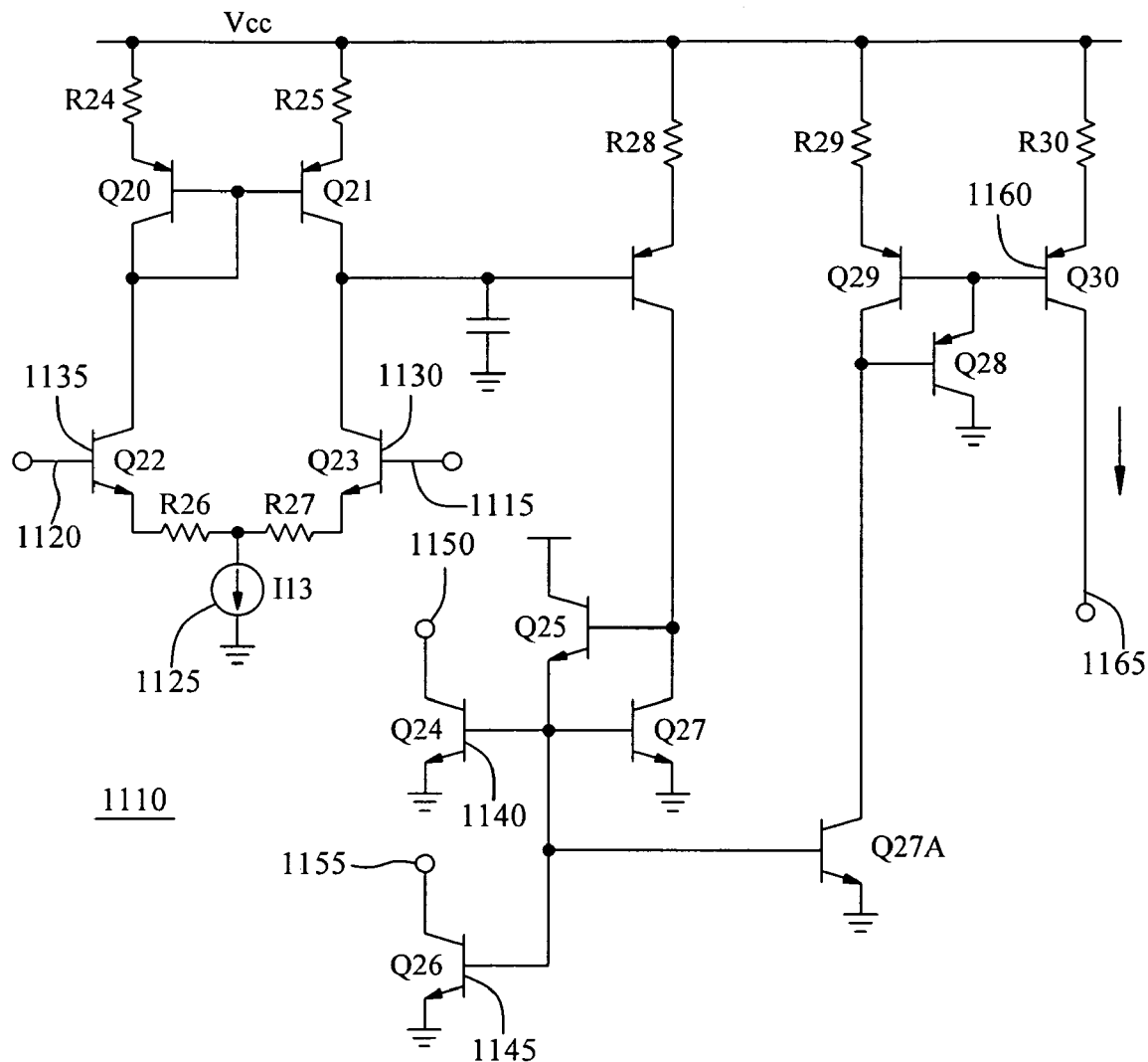
FIG. 11 is a circuit diagram of a DC buffer according to various embodiments of the invention.

FIG. 11 is a DC buffer 1110 according to various embodiments of the invention. In various embodiments of the invention, the DC buffer at least partially functions as the first gain block 355 and is positioned within a feedback loop to the DC variable-gain amplifier 375.

A DC voltage 1115 is generated at the base of transistor $Q_{23}$ 1130 by connecting the collector of transistor $Q_{39}$ 1050 to a resistor which in turn is connected to $V_{cc}$. A high-gain differential amplifier, consisting of transistors $Q_{22}$ 1135 and $Q_{23}$ 1130, compares the voltage 1115 and the voltage at the base 1120 of transistor $Q_{22}$ 1135 which is connected to the output 720 of the squarer. The high-gain differential amplifier forces these two voltages to be equal by feeding back current to the base of transistor $Q_{23}$ 1130 via the DC variable-gain amplifier 1005. When equilibrium is reached, the voltage fed back to the base of transistor $Q_{23}$ 1130 is equal to the amount of voltage from the squarer delivered to the base of the transistor $Q_{22}$ 1135.

The output from the differential amplifier controls the current coming out of the collector 1150 of transistor $Q_{24}$ 1140 and the collector 1155 of transistor $Q_{26}$ 1145. These currents are used as inputs into the DC variable-gain amplifier 1005, and match the RF current feeds into the RF variable-gain amplifier 510. Accordingly, in certain embodiments of the invention, the current in transistor $Q_{24}$ 1140 will be a fraction of the current in transistor $Q_{26}$ 1145 set by transistor area ratios between $Q_{24}$ and $Q_{26}$.

Transistor $Q_{30}$ 1160 taps the true RMS signal and feeds this tapped signal on output 1165 to a log amplifier that is discussed later. This tapped current is within a current range that corresponds to the voltage range on the RF input $V_i$ 515.

Figure 12:
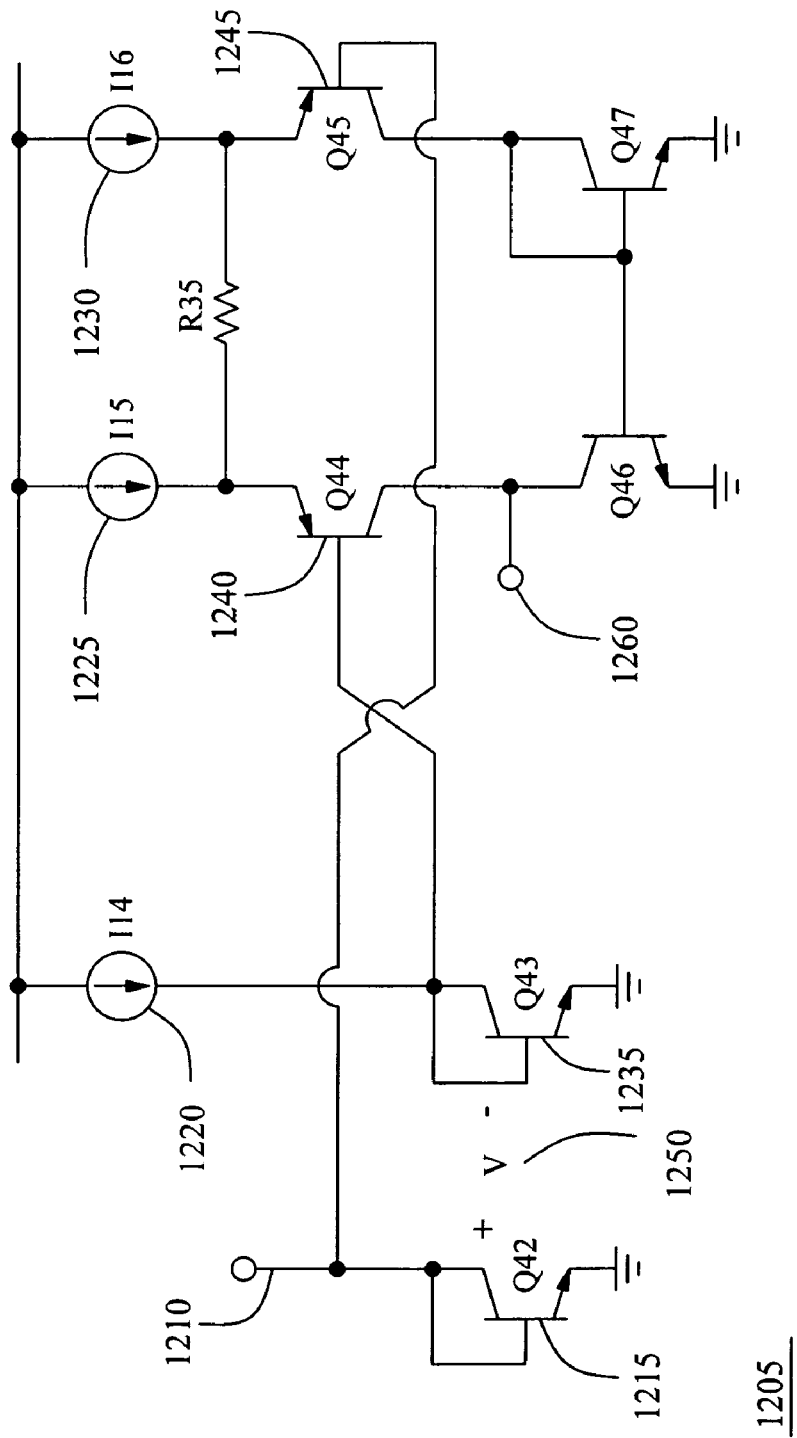
FIG. 12 is an exemplary logarithmic amplifier according to various embodiments of the invention.

FIG. 12 is a circuit diagram of a logarithmic amplifier according to various embodiments of the invention. The logarithmic amplifier 1205 provides a dB linear output in relation to the current on the collector of transistor $Q_{30}$ 1160.

The current from the collector of transistor $Q_{30}$ 1160 is provided at node 1210 that feeds transistor $Q_{42}$ 1215, which functions as a diode. A first reference current $I_{14}$ 1220 is provided on the collector of transistor $Q_{43}$ 1235, which functions as a diode. A second reference current $I_{15}$ 1225 is provided to the collector of transistor $Q_{44}$ 1240 and a third reference current $I_{16}$ 1230 is provided to the collector of transistor $Q_{45}$ 1245.

A differential output (V) 1250 is generated as the difference in voltage across $Q_{42}$ 1215 and $Q_{43}$ 1235. This voltage is given by:

$$\text{Differential Voltage} = V_T * \ln(I_{C42}/I_{C43})$$

where $V_T = kT/q$

This differential voltage 1250 is yielded with a PTAT dependence and is buffered by transistors $Q_{44}$ 1240 and $Q_{45}$ 1245. The output 1260 of the amplifier is a DC current from the buffered differential voltage 1250 and provided to an output buffer.

Figure 13:
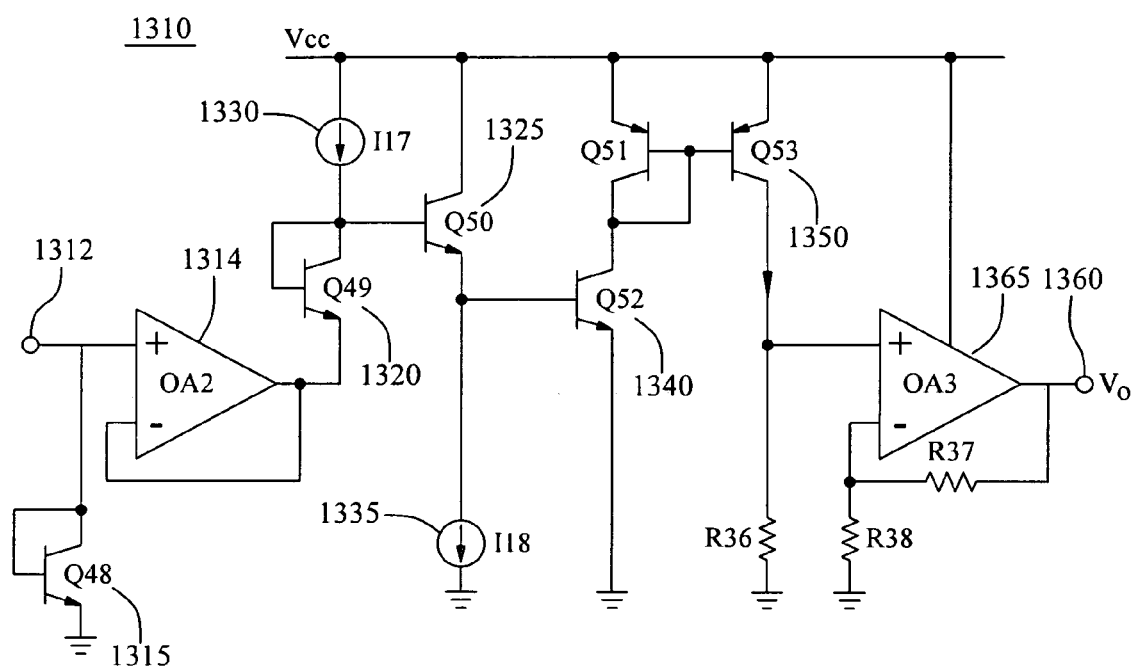
FIG. 13 illustrates an exemplary circuit for a buffer according to various embodiments of the invention.

FIG. 13 illustrates a circuit of an output buffer in accordance of various embodiments of invention. The PTAT dependency of the output 1260 of the amplifier is removed in the output buffer 1310. The current from the output 1260 from the logarithmic amplifier 1205 is provided on input 1312 on an amplifier 1314.

The current relationships through transistors $Q_{48}$ 1315, $Q_{49}$ 1320, $Q_{50}$ 1325, $Q_{52}$ 1340, and reference currents $I_{17}$ 1330 and $I_{18}$ 1335 may be defined as follows:

$$\frac{I_{c48}}{I_{s48}} \frac{I_{c49}}{I_{s49}} = \frac{I_{c50}}{I_{s50}} \frac{I_{c52}}{I_{s52}}$$

resulting in:

$$I_{c52} = \frac{I_{c48} I_{17}}{I_{18}} \frac{I_{s50} I_{s52}}{I_{s48} I_{s49}}$$

and:

$$I_{c52} = 4 I_{c48} \frac{I_{ref2}}{I_{PTAT}}$$

The output voltage $V_o$ 1360 is equal to the current on the collector of $Q_{53}$ 1350 multiplied by the resistance of $R_{36}$ multiplied by the gain of the amplifier 1365.

Figure 14:
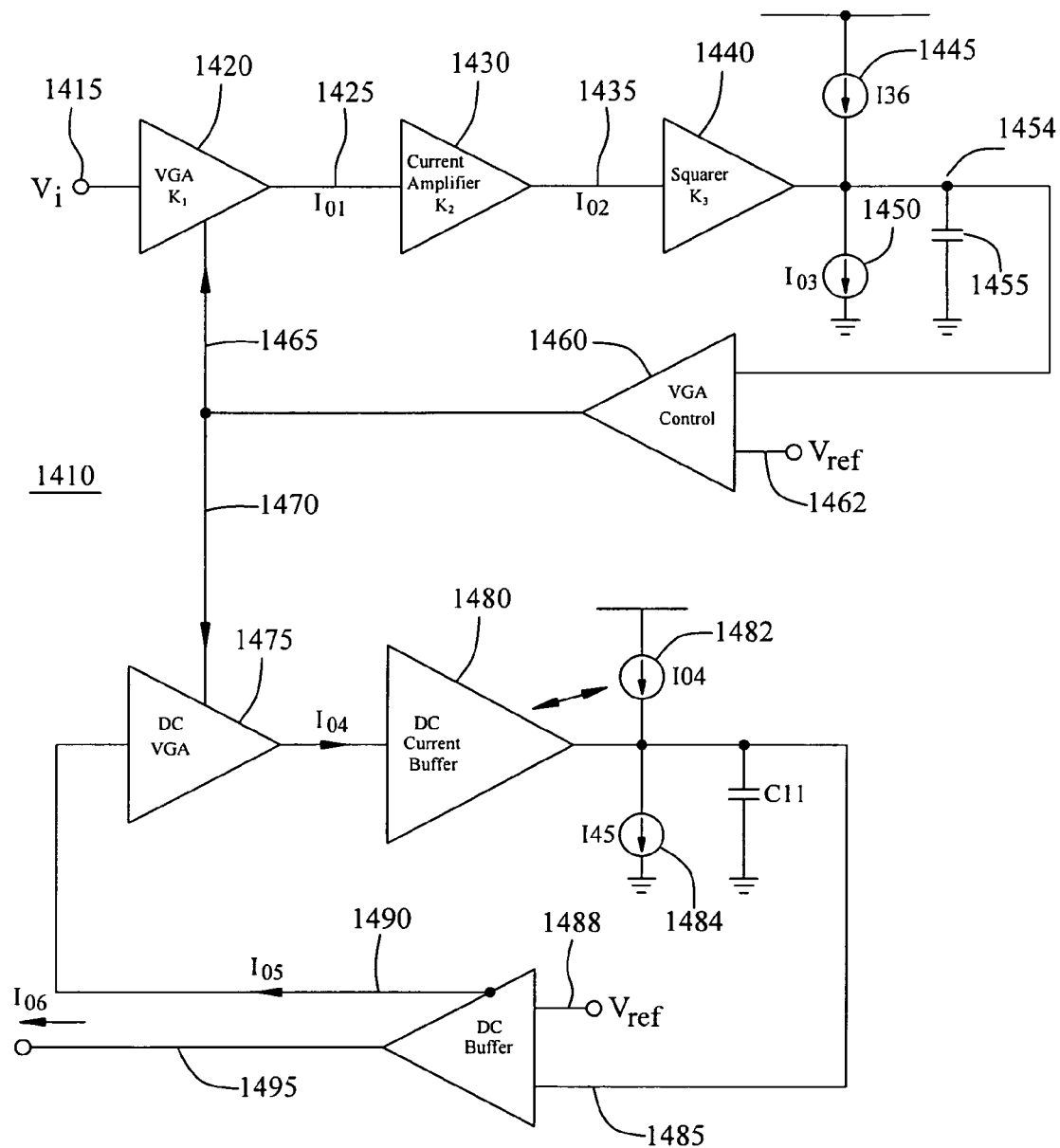
FIG. 14 is a current-based RMS detector according to various embodiments of the invention.

The embodiments of the RMS detector described above use voltage comparison at the output of the squarer. However, this comparison can also be made using currents as the comparison variables. FIG. 14 is a schematic of an RMS detector according to various embodiments of the invention. When compared to the RMS detector illustrated in FIGS. 3A and 3B, the RMS detector 1410 illustrated in FIG. 14 shows a current-based circuit that also generates an RMS measure of an RF input signal as a voltage output signal.

An input signal 1415 is received at an RF variable-gain amplifier 1420 that applies a variable-gain on the input signal 1415 that forces an output current $(I_{O1})$ 1425 to be constant. As the voltage $(V_i)$ on the input signal 1415 changes, the gain across the RF variable-gain amplifier 1420 will change in response thereto. The gain $(K_1)$ across the RF variable-gain amplifier 1420 may be calculated as $I_{O1}/V_i$ and changes relative to $V_i$ as $I_{O1}$ is forced constant.

This output current $(I_{O1})$ 1425 is received at a high-frequency current amplifier 1430 that applies a gain to the output current $(I_{O1})$ 1425 and generates an amplified current $(I_{O2})$ 1435. The gain $(K_2)$ of the HF current amplifier 1430 may be calculated as $I_{O2}/I_{O1}$.

The amplified current $(I_{O2})$ 1435 is provided to a squarer 1440 that performs a squaring operation. Because the output current $(I_{O1})$ 1425 on the RF variable-gain amplifier 1420 is constant or approximately constant, the range of the amplitude of the amplified current $(I_{O2})$ 1435 of the squarer 1440 is significantly reduced over the range of RF input signal amplitudes at $V_i$ 1415, which allows the squarer to always operate within its ideal squaring region. The squared current output $(I_{O3})$ is generated by the conversion gain on amplified current $(I_{O2})$ 1435.

The capacitor 1455 averages the signal at 1454 over a period of time. In various embodiments of the invention, the averaged, squared current of output $(I_{O3})$ is compared with a reference current $I_{36}$ 1445 by a variable-gain amplifier control circuit. This reference current may be generated on or off-chip. The variable-gain amplifier control circuit outputs a signal on a feedback loop that forces the mean squared current output $(I_{O3})$ to be equal or approximately equal to a reference current $I_{36}$ 1445. This relationship may be defined as:

$$I_{o3} = \overline{(K_1 K_2 V_i)^2} \times K_3 = I_{ref1}$$

from which:

$$K_1 = \frac{1}{K_2 \sqrt{\overline{V_i^2}}} \sqrt{\frac{I_{ref1}}{K_3}}$$

where $I_{36} = I_{ref1}$, $K_1$ is the transconductance of the variable-gain amplifier, $K_2$ is the current gain of the current amplifier and $K_3$ is the conversion current gain of the squarer.

Additionally, the output DC voltage 1454 on the squarer 1440 is forced to a reference voltage $V_{ref}$ 1462, which in certain embodiments is equal to $V_{BE}$. The feedback loop includes a first gain adjustment signal that adjusts the gain across the RF variable-gain amplifier 1420 so that the mean squared current output $(I_{O3})$ is forced to be equal or approximately equal to the reference current.

A second gain adjustment signal changes the gain across a DC variable-gain amplifier that generates output current $(I_{O4})$. This second gain adjustment relates to the output of the variable-gain amplifier control circuit, which was previously discussed, and changes a gain value on the DC variable-gain amplifier, which is at least in-part related to changes in the input signal $(V_i)$. The output current $(I_{O4})$ is provided to a DC current buffer having a current gain set at unity and generates a buffered output current. The buffered output current $(I_{O4})$ 1482 is forced to be equal to a second reference current, $I_{ref2} = I_{45}$ 1484, by changing the gain across the DC variable-gain amplifier. In various embodiments of the invention, the current gain across the DC variable-gain amplifier varies within a particular range and tracks the RF gain $(K_1)$ of the RF variable-gain amplifier.

The buffered output signal $(I_{O4})$ is provided on a first input of a DC buffer circuit and a reference voltage is provided on a second input of the DC buffer circuit. The DC buffer circuit generates a primary output $(I_{O6})$ that relates to the RMS voltage of the input signal $(V_i)$ and secondary output $(I_{O5})$ that is provided on an input to the DC variable-gain amplifier. The secondary output ($I_{o5}$) relates to buffered output signal ($I_{o4}$) based on the gain ($K_1$) across the RF variable-gain amplifier and a parameter, $R_x$, set by the ratio between the gains of the RF and DC variable-gain amplifiers.

$$\frac{I_{o4}}{I_{o5}} = K_1 R_x$$

In certain embodiments, $R_x$ is equal to 5 KΩ and the primary output ($I_{o6}$) is defined as:

$$I_{o6} = 4 I_{o5}$$

which results in the primary output ($I_{o6}$) being equal to:

$$I_{o6} = \frac{4 I_{o4}}{K_1 R_x} = \frac{4 I_{ref2}}{K_1 R_x}$$

Using the above-definition of the gain ($K_1$) across the RF variable-gain amplifier, the primary output ($I_{o6}$) on the DC buffer relates to the RMS voltage on ($V_i$) and is equal to:

$$I_{o6} = \frac{4 I_{ref2}}{R_x} K_2 \sqrt{\frac{K_3}{I_{ref1}}} \sqrt{V_i^2}$$

In certain embodiments, the transfer function from $\sqrt{V_i^2}$ to the primary output ($I_{o6}$) may be specified if the coefficients in the above equation have precise values. Accordingly, the true RMS voltage of the inputs signal ($V_i$) may be extracted from the primary output ($I_{o6}$) by the application of a scalar. The primary output ($I_{o6}$) is supplied to a logarithmic amplifier and an output buffer.

In certain embodiments, an RF variable-gain amplifier shown in FIG. 5 may be used within the current-based RMS detector. Additionally, in certain embodiments, a fixed-gain amplifier shown in FIG. 6 may be used in the current-based RMS detector.

Figure 15:
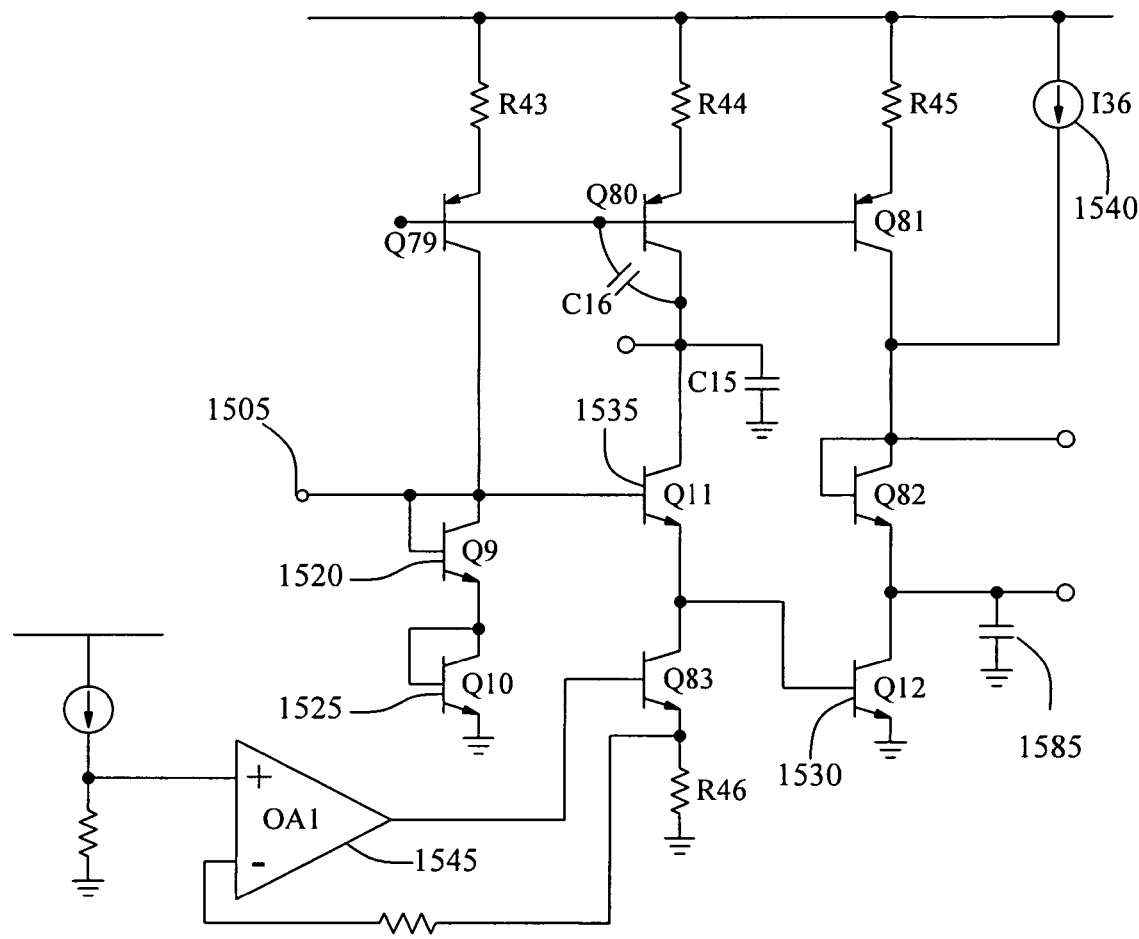
FIG. 15 is a current squarer according to various embodiments of the invention.

FIG. 15 illustrates a current squarer according to various embodiments of the invention. An input signal is provided on input 1505. The squaring function of the squarer is defined by a relationship between the current through transistors $Q_9$ 1520, $Q_{10}$ 1525, $Q_{11}$ 1535, and $Q_{12}$ 1530:

$$I_{c9} I_{c10} = I_{c11} I_{c12}$$

such that, $$I_{c12} = \frac{I_i^2}{I_{c83}}$$

where $I_i = I_{c79} + i_{c83}$ and $i_{c83}$ is the RF AC current in $Q_8$ 635 and the output current 650 from the fixed-gain amplifier 610. Current $I_{36}$ 1540 is a reference current. DC currents are defined through $Q_{79}$, $Q_{80}$ and $Q_{81}$, the values of which are at least partially defined by resistors $R_{43}$, $R_{44}$ and $R_{45}$.

The current through $Q_{12}$ is defined by the input squared over the current through $Q_{83}$, which is a constant current source. The amplifier 1545 forces a precise DC bias current in $Q_{83}$. The RF components of the squared signal are removed by a large external capacitor 1585 in order to provide a constant DC output voltage.

The foregoing description of the invention has been described for purposes of clarity and understanding. It is not intended to limit the invention to the precise form disclosed. Various modification may be possible within the scope and equivalence of the appended claims.

I claim:

1. An RMS detector comprising:
   a first variable-gain stage, coupled to receive an input signal, that applies a first variable gain on the input signal that forces a constant first output;
   a squaring stage, coupled to receive the constant first output, that generates a squared signal output of the constant first output;
   an averaging stage, coupled to receive the squared signal output, that generates an averaged squared signal output over a first period of time;
   a feedback loop, coupled to receive the averaged squared signal output, that adjusts a first gain value on the first variable-gain stage; and
   a second variable-gain stage, coupled to the feedback loop, that adjusts a second variable gain relative to a second gain value and generates an RMS output representative of an RMS of the input signal.

2. The RMS detector of claim 1 wherein the feedback loop comprises a gain block that forces the averaged squared signal to equal a reference voltage.

3. The RMS detector of claim 2 wherein the gain block comprises:
   a first input that receives a reference voltage at a first voltage level;
   a second input that receives the averaged squared signal; and
   an output, coupled to the first variable gain stage, that at least partially controls a gain across the first variable gain stage.

4. The RMS detector of claim 3 wherein the feedback loop comprises a first gain adjustment signal that is related to the output on the gain block and that controls the gain across the first variable gain stage.

5. The RMS detector of claim 4 wherein the feedback loop comprises a second gain adjustment signal that is related to the output on the gain block and that controls the gain across the second variable gain stage.

6. The RMS detector of claim 1 wherein the input signal is an RF signal.

7. The RMS detector of claim 1 wherein the averaging stage comprises an RC circuit that generates an averaged squared signal output over a period of time.

8. The RMS detector of claim 1 wherein the squaring stage comprises a squarer that squares the constant first output.

9. The RMS detector of claim 1 wherein the first variable-gain stage comprises a variable gain amplifier that applies the first variable gain that forces the constant first output.

10. The RMS detector of claim 1 wherein the second variable-gain stage receives a second gain adjustment that is at least partially related to a signal on the feedback loop and that comprises another feedback loop from the RMS output to an input on the second variable-gain stage.

11. The RMS detector of claim 10 wherein the RMS output is proportional to a true RMS value of the input signal.

12. The RMS detector of claim 11 further comprising a scaling amplifier, coupled to receive the RMS output, that applies a gain to the RMS output to generate a true RMS value signal.

13. A method for generating an RMS value, the method comprising:
   receiving an input signal;

adjusting a first gain across an RF variable-gain amplifier relative to voltage swings within the received input signal, such that an output on the RF variable-gain amplifier is forced to a constant;

adjusting a second gain across a RC variable-gain amplifier relative to a voltage swing within the received input signal; and generating an output signal from the DC variable-gain amplifier;

providing a feedback signal, at least partially derived from the output signal of the DC variable-gain signal coupling to the RF variable-gain amplifier and to the DC variable-gain amplifier, the feedback is proportional to an RMS value of the input signal.

14. The method of claim 13 further comprising the step of applying a scalar to the output signal that generates the RMS value of the input signal.

15. The method of claim 13 further comprising the steps of:
squaring an output of the RF variable-gain amplifier; and
averaging the squared output of the RF variable-gain amplifier over a period of time.

16. The method of claim 15 further comprising the step of forcing the averaged squared output of the RF variable-gain amplifier to be equal to a reference voltage.

17. The method of claim 13 wherein the feedback signal is generated by forcing the output of the DC variable-gain amplifier to a reference voltage.

18. The method of claim 17 wherein the feedback signal is provided on an input on the DC variable-gain amplifier.

19. The method of claim 13 wherein the first gain across the RF variable-gain amplifier and the second gain across the DC variable-gain amplifier is determined by a feedback loop comprising a squaring operation, an averaging operation, and a gain blocking operation.

20. The method of claim 19 wherein a first gain adjustment defining the first gain and a second gain adjustment defining the second gain is generated at least in part by the feedback loop.

21. A current-based RMS detector comprising:
a RF variable-gain amplifier, coupled to receive an input RF signal, that applies a first variable gain on the input signal that forces a constant first output current;
a current squarer, coupled to receive the constant first output current, that generates a squared current output from the constant first current output;
a feedback loop, coupled to receive the squared current output, that adjusts a first gain value on the RF variable-gain amplifier;
a DC variable-gain amplifier, coupled to the feedback loop, that adjusts a second variable gain across the DC variable-gain amplifier relative to a second gain value in relation to the voltage change on the input RF signal and outputs a DC amplified current output; and
a first gain block, coupled to received the DC amplified output, that forces the DC amplified current output to be equal to a first reference current and generates an RMS output current that is proportional to a true RMS value of the input RF signal.

22. The current-based RMS detector of claim 21 further comprising a fixed-gain DC amplifier, coupled to receive the constant first output current, that applies a gain to the constant first output current so that the constant first output current falls within a preferred squaring region of the squarer.

23. The current-based RMS detector of claim 21 further comprising a second gain block, coupled within the feedback loop, that forces the squared current output to equal a second reference current.

24. The current-based RMS detector of claim 21 further comprising an averager, coupled to receive the squared current output, that generates an averaged current output equal to an average of the squared current output over a period of time.

25. The current-based RMS detector of claim 21 further comprising a fixed-gain amplifier, coupled to receive the RMS output current, that applies a gain to the RMS output current to extract a true RMS output current for the input RF signal.

26. The current-based RMS detector of claim 25 wherein the gain applied to the RMS output is related to a ratio of the squared current output and a second reference voltage.

27. A voltage-based RMS detector comprising:
a RF variable-gain amplifier, coupled to receive an input RF signal, that applies a first variable gain on the input signal that forces a constant first output voltage;
a first fixed-gain voltage amplifier, coupled to receive the constant first output voltage, that applies a gain to the constant first output voltage resulting in an amplified constant first output voltage falling within a preferred squaring region;
a voltage squarer, coupled to receive the amplified constant first output voltage, that generates a squared voltage output from the amplified constant first voltage output;
a feedback loop, coupled to receive the squared voltage output, that adjusts a first gain value on the RF variable-gain amplifier in relation to voltage changes within the input RF signal;
a DC variable-gain amplifier, coupled to the feedback loop, that adjusts a second variable gain across the DC variable-gain amplifier relative to a second gain value that was derived in part from the voltage changes within the input RF signal, and generates a DC amplified voltage output; and
a first gain block, coupled to received the DC amplified voltage output, that forces the DC amplified voltage output to be equal to a first reference voltage and generates an RMS output voltage that is proportional to a true RMS value of the input RF signal.

28. The voltage-based RMS detector of claim 27 further comprising a second gain block, coupled within the feedback loop, that forces the squared voltage output to equal a second reference voltage.

29. The voltage-based RMS detector of claim 27 further comprising an averager, coupled to receive the squared voltage output, that generates an averaged voltage output equal to an average of the squared voltage output over a period of time.

30. The voltage-based RMS detector of claim 29 wherein the averaged voltage output is forced to be equal to a second reference voltage.

31. The voltage-based RMS detector of claim 27 further comprising a fixed-gain amplifier, coupled to receive the RMS output voltage, that applies a gain to the RMS output voltage to extract a true RMS output voltage for the input RF signal.

32. The voltage-based RMS detector of claim 31 wherein the gain applied to the RMS output is related to a ratio of the squared voltage output and a second reference voltage.

* * * * *